(12) United States Patent
Lee et al.

(10) Patent No.: US 11,245,864 B2
(45) Date of Patent: Feb. 8, 2022

(54) COMPARATOR AND IMAGE SENSOR INCLUDING THE SAME

(71) Applicant: Samsung Electronics Co., Ltd., Suwon-si (KR)

(72) Inventors: Junan Lee, Seongnam-si (KR); Sungyong Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 16/907,776

(22) Filed: Jun. 22, 2020

(65) Prior Publication Data

US 2021/0176419 A1    Jun. 10, 2021

(30) Foreign Application Priority Data

Dec. 10, 2019 (KR) .......................... 10-2019-0163634

(51) Int. Cl.
*H04N 5/378* (2011.01)
*H04N 5/3745* (2011.01)
*H03M 1/50* (2006.01)

(52) U.S. Cl.
CPC .............. *H04N 5/378* (2013.01); *H03M 1/50* (2013.01); *H04N 5/37452* (2013.01); *H04N 5/37455* (2013.01)

(58) Field of Classification Search
CPC ............... H04N 5/378; H04N 5/37452; H04N 5/37455; H03M 1/50
See application file for complete search history.

(56) References Cited

U.S. PATENT DOCUMENTS

| | | |
|---|---|---|
| 8,487,802 B2 | 7/2013 | Naka et al. |
| 9,106,849 B2 | 8/2015 | Duggal et al. |
| 10,021,331 B2 | 7/2018 | Sakakibara et al. |
| 10,051,221 B2 | 8/2018 | Sakakibara |
| 10,075,155 B2 | 9/2018 | Kikuchi et al. |
| 2017/0272678 A1* | 9/2017 | Sakakibara ........ H04N 5/37455 |
| 2018/0013412 A1* | 1/2018 | Kikuchi ............. H04N 5/23241 |
| 2019/0208151 A1* | 7/2019 | Taura ...................... H03M 1/34 |

(Continued)

FOREIGN PATENT DOCUMENTS

| | | |
|---|---|---|
| JP | 20020237743 A | 8/2002 |
| JP | 20170135479 A | 8/2017 |

*Primary Examiner* — Nicholas G Giles
(74) *Attorney, Agent, or Firm* — Harness, Dickey & Pierce, P.L.C.

(57) ABSTRACT

A comparator includes a comparison circuit and a positive feedback circuit. The comparison circuit generates a comparison signal by comparing an input signal and a reference signal. The positive feedback circuit generates an output signal based on the comparison signal, such that the output signal transitions more rapidly than the comparison signal. The positive feedback circuit includes a first circuit configured to electrically connect a first power supply voltage to a conversion node in response to a transition of the comparison signal and electrically disconnect the first power supply voltage from the conversion node in response to a transition of the output signal, a second circuit configured to electrically connect a second power supply voltage to the conversion node in response to the transition of the output signal, and an output circuit configured to generate the output signal based on a voltage of the conversion node.

20 Claims, 20 Drawing Sheets

(56) References Cited

U.S. PATENT DOCUMENTS

| | | | |
|---|---|---|---|
| 2020/0029036 A1* | 1/2020 | Iida | H04N 5/35554 |
| 2020/0228738 A1* | 7/2020 | Ogawa | H04N 5/225 |
| 2021/0067168 A1* | 3/2021 | Kitano | H04N 5/361 |

* cited by examiner

800

COMPARATOR AND IMAGE SENSOR INCLUDING THE SAME

CROSS-REFERENCE TO RELATED APPLICATION

This U.S. non-provisional application claims priority under 35 USC § 119 to Korean Patent Application No. 10-2019-0163634, filed on Dec. 10, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a comparator and an image sensor including the comparator.

2. Discussion of the Related Art

Semiconductor devices may include comparators to perform analog-to-digital conversion. For example, an image sensor may include a large number of comparators to convert analog signals, which are provided from pixels of the image sensor, to digital signals. The number of the comparators increases as the resolution of the image sensor is increased. Accordingly performance, power consumption and/or occupation area of the comparators directly affect the performance, power consumption and size of the image sensor.

SUMMARY

Some example embodiments may provide a comparator capable of operating with low power consumption, and an image sensor including the comparator.

According to example embodiments, a comparator includes a comparison circuit and a positive feedback circuit. The comparison circuit generates a comparison signal by comparing an input signal and a reference signal. The positive feedback circuit generates an output signal based on the comparison signal, such that the output signal transitions more rapidly than the comparison signal. The positive feedback circuit includes a first circuit configured to electrically connect a first power supply voltage to a conversion node in response to a transition of the comparison signal and electrically disconnect the first power supply voltage from the conversion node in response to a transition of the output signal, a second circuit configured to electrically connect a second power supply voltage to the conversion node in response to the transition of the output signal, and an output circuit configured to generate the output signal based on a voltage of the conversion node.

According to example embodiments, an image sensor includes a pixel array comprising a plurality of pixels configured to convert incident light to analog signals and an analog-to digital converter configured to convert the analog signals output from the pixel array to digital data. The analog-to-digital converter includes a plurality of comparators configured to generate output signals based on the analog signals and a reference signal. Each of the plurality of comparators includes a comparison circuit configured to generate a comparison signal by comparing an input signal corresponding to each of the analog signals and the reference signal, and a positive feedback circuit configured to generate an output signal based on the comparison signal, such that the output signal transitions more rapidly than the comparison signal. The positive feedback circuit includes the first circuit, the second circuit and the output circuit.

According to example embodiments, a comparator includes a comparison circuit configured to generate a comparison signal by comparing an input signal and a reference signal, and a positive feedback circuit configured to generate an output signal based on the comparison signal, such that the output signal transitions more rapidly than the comparison signal. The positive feedback circuit includes a first P-channel metal oxide semiconductor (PMOS) transistor connected between a first power supply voltage and a first node and configured to be turned on and off in response to the comparison signal, a first N-channel metal oxide semiconductor (NMOS) transistor connected between the first node and a conversion node and configured to be turned on and off in response to the output signal, a second PMOS transistor connected between a second power supply voltage and the conversion node and configured to be turned on and off in response to the output signal, a second NMOS transistor connected between the conversion node and a ground voltage and configured to be turned on and off in response to an initialization signal, and an output circuit configured to generate the output signal based on a voltage of the conversion node.

The comparator and the image sensor including the comparator according to example embodiments may reduce power consumption and/or size and have enhanced operation characteristics by removing the static current of the positive feedback circuit included in the comparator.

BRIEF DESCRIPTION OF THE DRAWINGS

Example embodiments of the present disclosure will be more clearly understood from the following detailed description taken in conjunction with the accompanying drawings.

DETAILED DESCRIPTION OF EXAMPLE EMBODIMENTS

Figure 1:
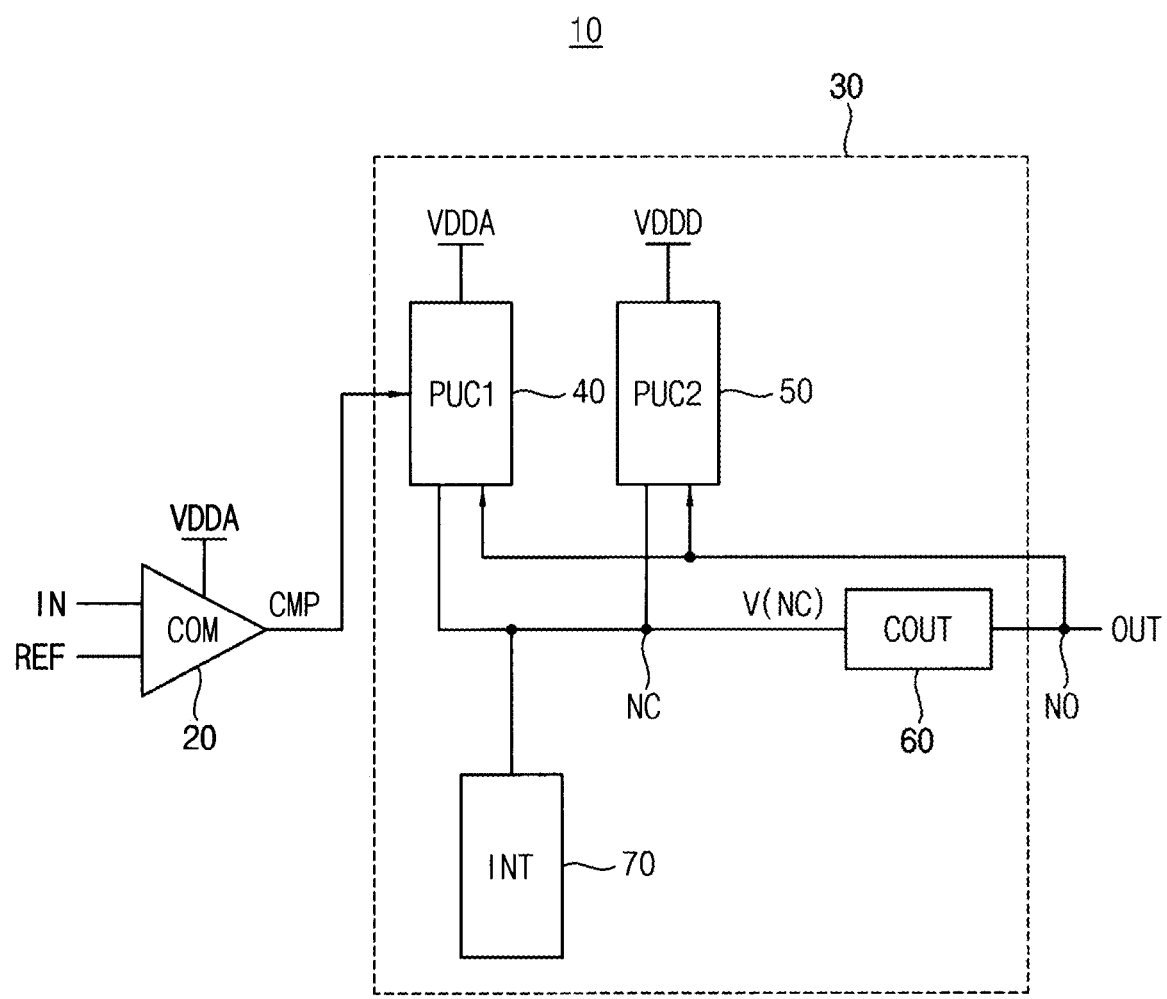
FIG. 1 is a block diagram illustrating a comparator according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a comparator according to example embodiments.

Referring to FIG. 1, a comparator 10 may include a comparison circuit COM 20 and/or a positive feedback circuit 30.

The comparison circuit 20 may generate a comparison signal CMP by comparing an input signal IN and a reference signal REF. The comparison signal CMP may be a ramp signal such that a voltage level of the ramp signal decreases gradually. The configuration of the comparison circuit 20 may be determined variously, and an example configuration of the comparison circuit 20 will be described below with reference to FIG. 6.

The positive feedback circuit 30 may generate an output signal OUT based on the comparison signal CMP such that the output signal OUT may transition more rapidly than the comparison signal CMP. The transition timings of the comparison signal CMP and the output signal OUT will be described below with reference to FIG. 4.

The positive feedback circuit 30 may include a first circuit PUC1 40, a second circuit PUC2 50 and/or an output circuit COUT 60. In some example embodiments, the positive feedback circuit 30 may further include an initialization circuit INT 70.

The first circuit 40 may electrically connect a first power supply voltage VDDA to a conversion node NC in response to a transition of the comparison signal CMP. In addition, the first circuit 40 may electrically disconnect the first power supply voltage VDDA from the conversion node NC in response to a transition of the output signal OUT.

The second circuit 50 may electrically connect a second power supply voltage VDDD to the conversion node NC in response to the transition of the output signal OUT.

As such, by operating in response to the same output signal OUT, the first circuit 40 may electrically disconnect the first power supply voltage VDDA from the conversion node NC in response to the transition of the output signal OUT, and simultaneously the second circuit 50 may electrically connect the second power supply voltage VDDD to the conversion node NC in response to the transition of the output signal OUT. The operation of the first circuit 40 and the second circuit 50 may be implemented using switching elements. In some example embodiments, as will be described below with reference to FIG. 3, the switching elements of the first circuit 40 and the second circuit 50 may be implemented as metal oxide semiconductor (MOS) transistors.

The output circuit 60 may generate the output signal OUT based on a voltage V(NC) of the conversion node NC. As will be described below with reference to FIGS. 3 and 7, the output circuit 60 may include at least one logic gate connected between the conversion node NC and an output node NO generating the output signal OUT.

The initialization circuit 70 may initialize the voltage V(NC) of the conversion node NC before the transition of the comparison signal CMP.

Even though the detailed configuration of the positive feedback circuit 30 may be changed variously, in example embodiments, the positive feedback circuit 30 has a configuration such that the first power supply voltage VDDA, the second power supply voltage VDDD and a ground voltage are not electrically connected to each other to reduce or prevent generation of a static current.

As such, the comparator according to example embodiments may reduce power consumption by removing the static current of the positive feedback circuit included in the comparator.

Figure 2:
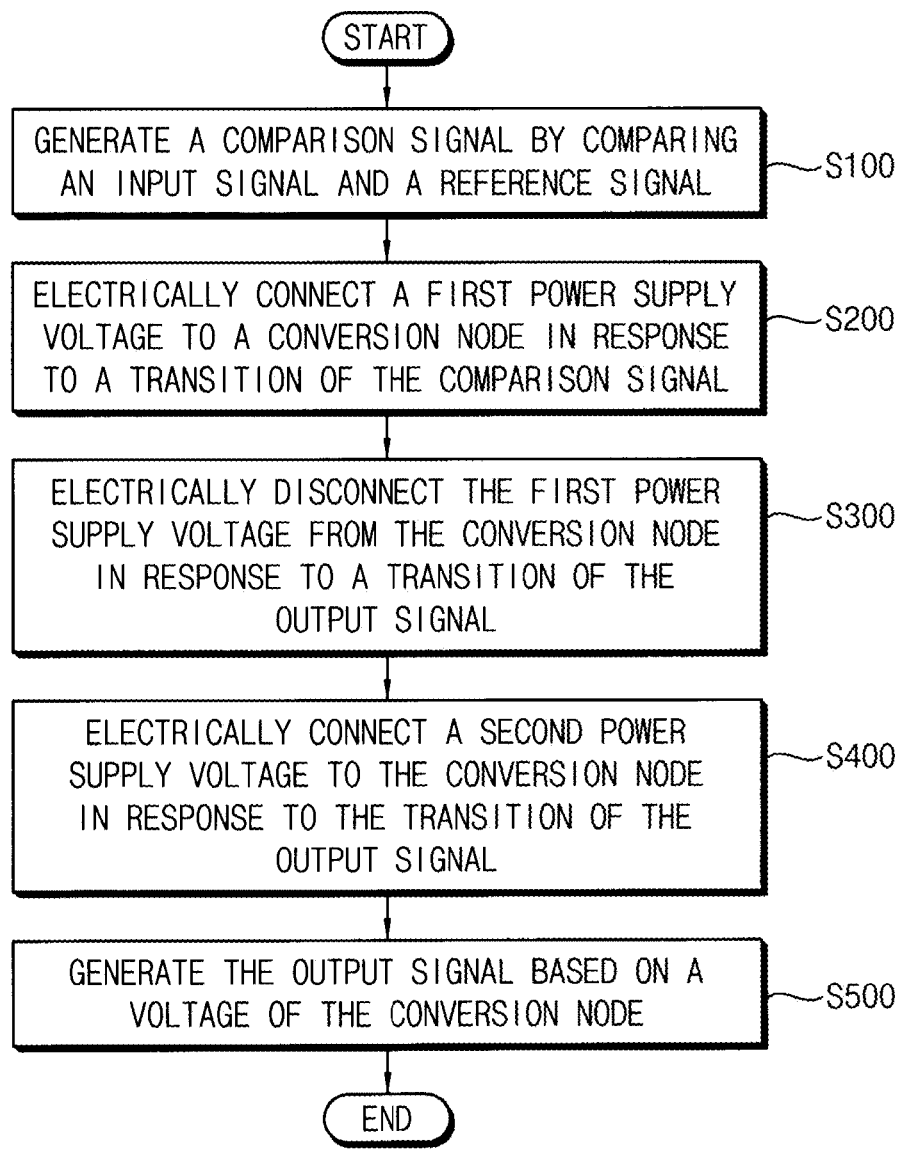
FIG. 2 is a flow chart illustrating a method of operating a comparator according to example embodiments.

FIG. 2 is a flow chart illustrating a method of operating a comparator according to example embodiments.

Referring to FIGS. 1 and 2, using the comparison circuit 20, the comparison signal CMP may be generated by comparing the input signal IN and the reference signal REF (S100).

Using the first circuit 40 of the positive feedback circuit 30, the first power supply voltage VDDA may be electrically connected to the conversion node NC in response to the transition of the comparison signal CMP (S200).

In addition, using the first circuit 40 of the positive feedback circuit 30, the first power supply voltage VDDA may be electrically disconnected from the conversion node NC in response to the transition of the output signal OUT (S300).

Using the second circuit 50 of the positive feedback circuit 30, the second power supply voltage VDDD may be electrically connected to the conversion node NC in response to the transition of the output signal OUT (S400).

Using the output circuit 60 of the positive feedback circuit 30, the output signal OUT may be generated based on the voltage V(NC) of the conversion node NC.

Figure 3:
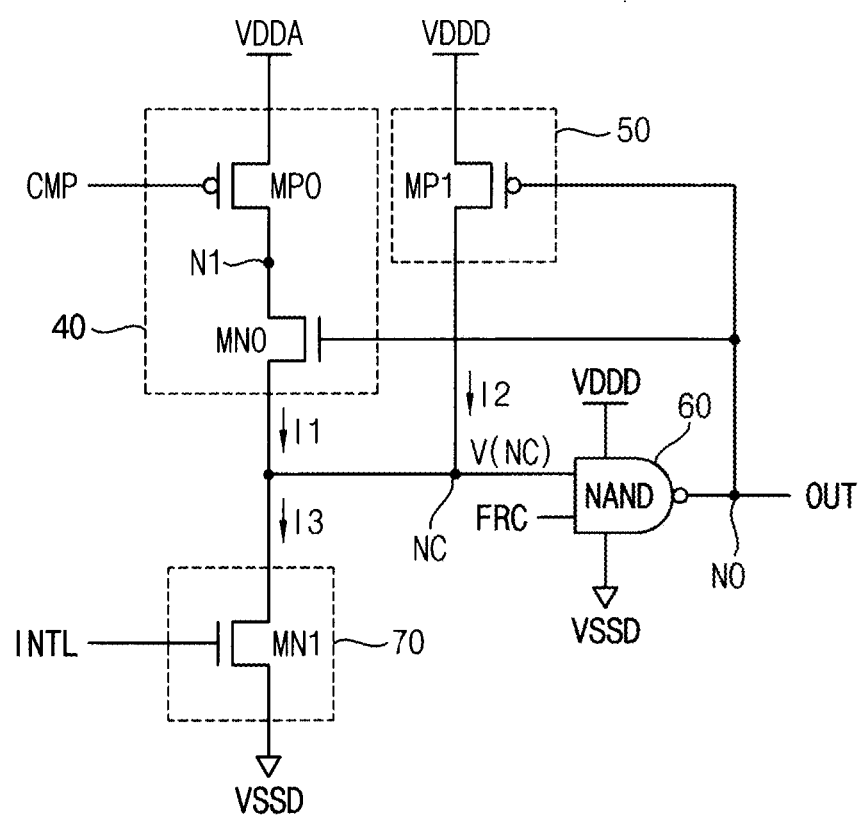
FIG. 3 is a circuit diagram illustrating example embodiments of a positive feedback circuit included in a comparator according to example embodiments.

FIG. 3 is a circuit diagram illustrating example embodiments of a positive feedback circuit included in a comparator according to example embodiments.

Referring to FIG. 3, a positive feedback circuit 30 may include a first circuit 40, a second circuit 50, an output circuit 60 and/or an initialization circuit 70.

The first circuit 40 may electrically connect a first power supply voltage VDDA to a conversion node NC in response to the transition of the comparison signal CMP. When the first circuit 40 electrically connects the first power supply voltage VDDA to the conversion node NC, the first circuit 40 may provide a first current I1 to the conversion node NC.

In addition, the first circuit 40 may electrically disconnect the first power supply voltage VDDA from the conversion node NC in response to the transition of the output signal OUT. When the first circuit 40 electrically disconnects the first power supply voltage VDDA from the conversion node NC, the first circuit 40 may block the first current I1 provided to the conversion node NC.

In some example embodiments, as illustrated in FIG. 3, the first circuit 40 may include a first pull-up transistor MP0 and/or a block transistor MN0. The first pull-up transistor MP0 may be connected between the first power supply voltage VDDA and a first node N1 and the first pull-up transistor MP0 may be switched, that is turned on and off in response to the comparison signal CMP. The block transistor MN0 may be connected between the first node N1 and the conversion node NC and the block transistor MN0 may be turned on and off in response to the output signal OUT.

The second circuit 50 may electrically connect the second power supply voltage VDDD to the conversion node NC in response to the transition of the output signal OUT. When the second circuit 50 electrically connects the second power supply voltage VDDD to the conversion node NC, the second circuit 50 may provide a second current I2 to the conversion node NC.

In some example embodiments, as illustrated in FIG. 3, the second circuit 50 may include a second pull-up transistor MP1. The second pull-up transistor MP1 may be connected between the second power supply voltage VDD and the conversion node NC and the second pull-up transistor MP1 may be turned on and off in response to the output signal OUT.

As a result, by operating in response to the same output signal OUT, the block transistor MN0 of the first circuit 40 may electrically disconnect the first power supply voltage VDDA from the conversion node NC in response to the transition of the output signal OUT, and simultaneously the second pull-up transistor MP1 of the second circuit 50 may electrically connect the second power supply voltage VDDD to the conversion node NC in response to the transition of the output signal OUT. The first current I1 and the second current I2 correspond to sourcing currents or pull-up currents that increase the voltage level of the conversion node NC.

As will be described below with reference to FIG. 4, the first current I1 and the second current I2 are not generated simultaneously but alternatively by the complementary switching operations of the block transistor MN0 and the second pull-up transistor MP1. Accordingly, the static current between the first power supply voltage VDDA and the second power supply voltage VDDD may be reduced or prevented.

Such switching operation of the first circuit 40 and the second circuit 50 may be implemented using MOS transistors. In some example embodiments, as illustrated in FIG. 3, the first pull-up transistor MP0 and the second pull-up transistor MP1 may be implemented with P-channel metal oxide semiconductor (PMOS) transistors and the block transistor MN0 may be implemented with an N-channel metal oxide semiconductor (NMOS) transistor.

According to example embodiments, the voltage level of the second power supply voltage VDDD may be lower than the voltage level of the first power supply voltage VDDA. The first power supply voltage VDDA may be used as an operation voltage of the comparison circuit 20 and an analog circuit block disposed before the comparison circuit 20. The first power supply voltage VDDA may have a relatively high voltage level, for example, 2.8V. The second power supply voltage VDDD may be used as an operation voltage of a digital circuit block after the positive feedback circuit 30. The second power supply voltage VDDD may have a relatively low voltage level, for example, 1.0V. In some example embodiments, a thickness of gate oxides of the first pull-up transistor MP0 and the block transistor MN0 may be greater than a thickness of a gate oxide of the second pull-up transistor MP1.

The output circuit 60 may generate the output signal OUT based on a voltage V(NC) of the conversion node NC. The output circuit 60 may include at least one logic gate connected between the conversion node NC and an output node NO generating the output signal OUT. In some example embodiments, as illustrated in FIG. 3, the output circuit 60 may include a NAND gate configured to receive the voltage V(NC) of the conversion node NC and an output control signal FRC and output the output signal OUT.

The initialization circuit 70 may initialize the voltage V(NC) of the conversion node NC before the transition of the comparison signal CMP. In some example embodiments, as illustrated in FIG. 3, the initialization circuit 70 may include an NMOS transistor MN1 connected between the conversion node NC and a ground voltage VSSD and configured to be turned on and off in response to an initialization signal INTL. When the NMOS transistor is turned on, that is, when the conversion node NC is electrically connected to the ground voltage VSSD, the initialization circuit 70 may provide a third current I3 to the conversion node NC. The third current I3 corresponds to a sinking current or a pull-down current that decreases the voltage level of the conversion node NC.

As will be described below with reference to FIG. 4, the NMOS transistor MN1 of the initialization circuit 70 may be turned on before the first current I1 and the second current I2 are generated. Accordingly the static current or the short current, which may be caused between the first power supply voltage VDDA, the second power supply voltage VDDD and the ground voltage VSSD, may be reduced or prevented.

Figure 4:
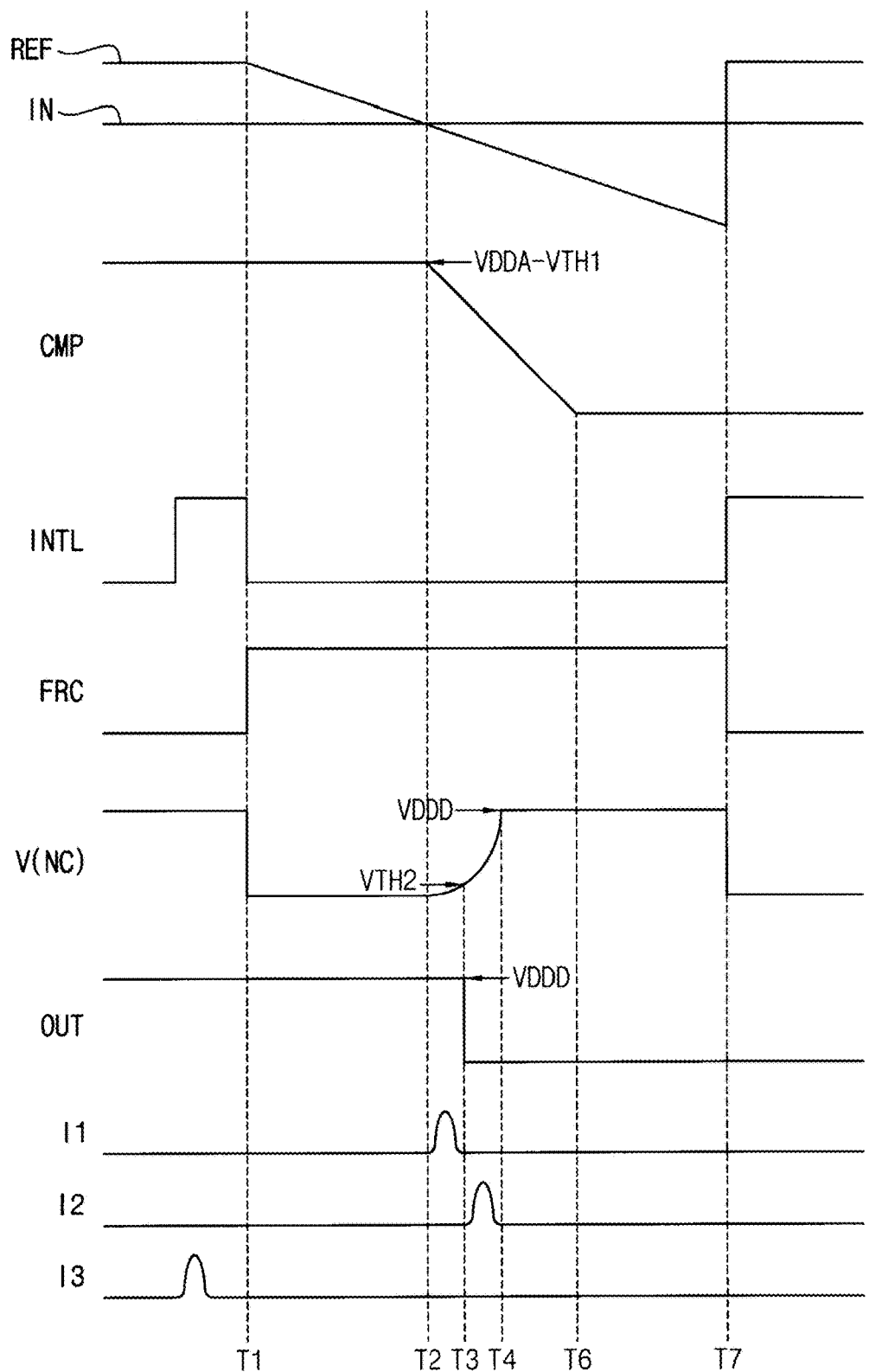
FIG. 4 is a timing diagram illustrating an operation of a comparator including the positive feedback circuit of FIG. 3.

FIG. 4 is a timing diagram illustrating an operation of a comparator including the positive feedback circuit of FIG. 3.

Referring to FIGS. 3 and 4, before a first time point T1, the initialization signal INTL is activated in the logic high level to turn on the NMOS transistor MN1 of the initialization circuit 70, and the conversion node NC is initialized to the ground voltage VSSD.

As illustrated in FIG. 4, the reference signal REF may be a ramp signal having a voltage level that decreases gradually. At the first time point T1, the output control signal FRC is activated in the logic high level, the initialization signal INTL is deactivated in a logic low level, and the voltage V(NC) of the conversion node NC may be maintained near the ground voltage VSSD. After that, the reference signal REF may begin decreasing.

At a second time point T2 when the voltage level of the reference signal REF becomes equal to the voltage level of the input signal IN, the voltage level of the comparison signal CMP may begin decreasing from the first power supply voltage VDDA subtracted by a threshold voltage VTH1, and the voltage V(NC) of the conversion node NC increases by the first current I1. In some example embodiments, the threshold voltage VTH1 may be the threshold voltage of the transistors TP1 and TP2 forming a current mirror in FIG. 6. At a third time point T2 when the voltage V(NC) of the conversion node NC exceeds a threshold voltage VTH2 of the NAND gate 60, the voltage level of the output signal OUT drops from the second power supply voltage VDDD to the ground voltage VSSD.

Accordingly, at the third time point T3, the block transistor MN0 is turned off, the second pull-up transistor MP1 is turned on, and the second I2 is provided to the conversion node NC. The second current I2 is provided until a fourth time point T4 when the voltage level of the conversion node NC becomes substantially equal to the second power supply voltage VDDD and the voltage V(NC) of the conversion node NC may be maintained as the second power supply voltage VDDD after the fourth time point T4.

At a fifth time point T5, the voltage level of the comparison signal CMP may attain the second power supply voltage VDDD. As a sixth time point T6, the output control signal FRC is deactivated in the logic low level, and the comparator 10 and the reference signal REF may be reset for a next operation.

As described with reference to FIGS. 3 and 4, the block transistor MN0, the second pull-up transistor MP1 and the NMOS transistor MN1 of the initialization 70 are not turned on simultaneously, and the first current I1, the second current I2 and the third current I3 are not generated simultaneously. As such, the comparator 10 may have a configuration such that the first power supply voltage VDDA, the second power supply voltage VDDD and the ground voltage VSSD are not electrically connected to each other to reduce or prevent generation of a static current.

As illustrated in FIG. 4, the comparison signal CMP may transition slowly from the second time point T2 to the sixth time point T6. In contrast, the output signal OUT may transition rapidly at the third time point T3. As a result, the positive feedback circuit 3 of the comparator 10 may generate the output signal OUT transitioning more rapidly than the comparison signal CMP.

Figure 5A:
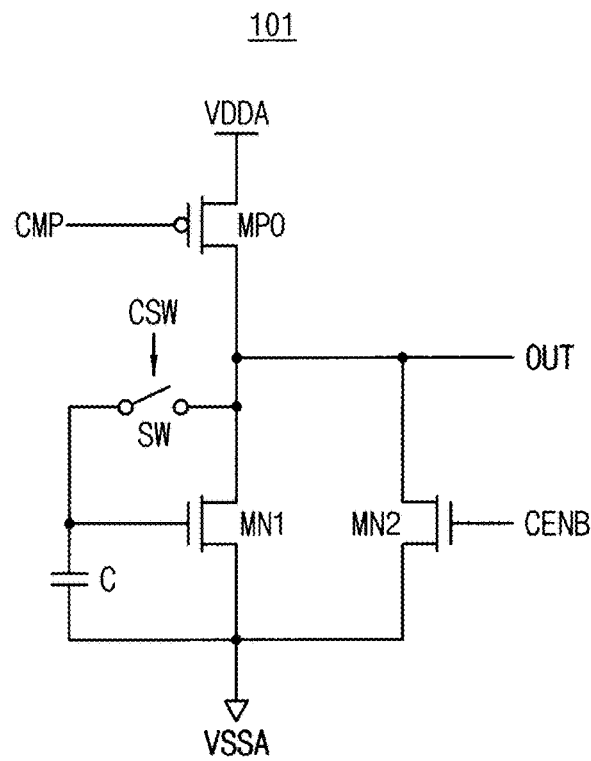
FIGS. 5A and 5B are circuit diagrams illustrating positive feedback circuits capable of performing a function similar to that of a comparator according to example embodiments.
Figure 5B:
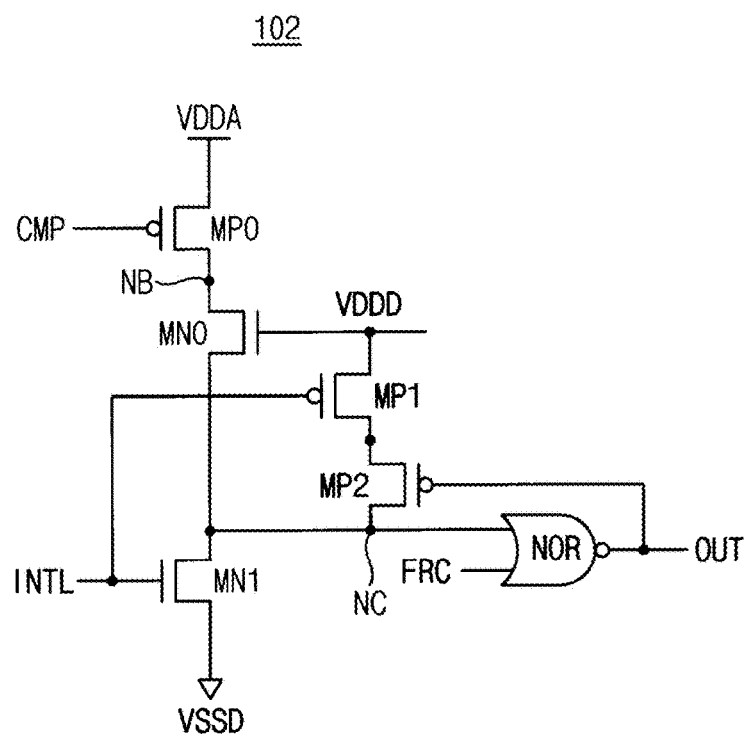

FIGS. 5A and 5B are circuit diagrams illustrating positive feedback circuits capable of performing a function similar to that of a comparator according to example embodiments.

Referring to FIG. 5A, a positive feedback circuit 101 may include transistors MP0, MN1 and MN2, a switch SW and/or a capacitor C disposed between a first power supply voltage VDDA and a ground voltage VSSD. The positive feedback circuit 101 may generate an output voltage VOUT based on control signals CENB and CSW and a comparison signal CMP.

The positive feedback circuit 101 of FIG. 5A adopts an amplifier of a common source type. The positive feedback circuit 101 may have a relatively simple configuration that may impose a gain for a full swing. However, a current proportional to the current of the comparison circuit of a previous stage may flow in the positive feedback circuit 101. If the positive feedback circuit 101 is used in an image sensor operating in higher resolution and/or higher frame rate, the current of the comparison circuit increases and thus the current of the positive feedback circuit 101 is increased.

The positive feedback circuit 101 samples a self-biasing voltage during auto-zeroing, and the switch SW and the sampling capacitor C maintains the voltage after the auto-zeroing. The sampling capacitor C requires a capacitance above several fF that occupies a large portion of the area of the analog-to-digital conversion circuit included in a column-parallel image sensor. In addition, in the positive feedback circuit 101 of the common source type, the current are varied before and after the comparison time point, which causes ground fluctuation and degradation of operational characteristics. The comparison time point indicates a time point when the voltage level of the input signal IN and the voltage level of the reference signal REF are reversed with respect to each other.

The positive feedback circuit 30 according to example embodiments generates only the dynamic currents and does not cause the static current path as the positive feedback circuit 101 of FIG. 5A, and thus may reduce the power consumption of the positive feedback circuit. Also the positive feedback circuit 30 according to example embodiments may reduce or prevent the degradation of the operational characteristics due to the ground fluctuation. In addition, the positive feedback circuit 30 according to example embodiments may remove the sampling capacitor C and the switch SW, and thus may significantly reduce the size of the positive feedback circuit. Further, when the positive feedback circuit 30 according to example embodiments is adopted in an image sensor, the ground voltage may be shared by the positive feedback circuit and the digital circuit block of a post stage and the deviation due to the ground fluctuation may be further reduced.

Referring to FIG. 5B, a positive feedback circuit 102 may include transistors MP0, MP1, MP2, MN1 and MN2 and a NOR gate disposed between a first power supply voltage VDDA and a ground voltage VSSD. The positive feedback circuit 102 may generate an output voltage VOUT based on control signals CENB and CSW and a comparison signal CMP.

In the positive feedback circuit 102, before a comparison operation, the initialization signal INTL is activated in the logic high level, the conversion node NC is pulled down to the ground voltage VSSD and the output signal OUT transitions to the logic high level. The voltage level of the comparison signal CMP decreases slowly according to the decrease of the reference signal and the voltage of the conversion node NC begins increasing from the ground voltage VSSD at the comparison time point. After that, when the voltage level of the comparison signal CMP exceeds the threshold voltage of the NOR gate, the output signal OUT transitions to the logic low level and the conversion node NC is pulled up to the second power supply voltage VDDD. As a result, the output signal OUT transitions from the logic high level to the logic low level at the comparison time point.

Even though the positive feedback circuit 102 may have low power consumption, it has the following disadvantages. Firstly, the voltage of the node NB may not be estimated at the floating time point of the node NB, and thus settling of the node NB may be delayed and the unstable state of the node NB may affect the conversion node NC. Secondly, after the comparison time point, the transistors MP1 and MP2 are turned on, the transistor MO0 in the saturation region acts as a resistor, and the transistor MN0 in the subthreshold region acts as a large resistor. Accordingly the first power supply voltage VDDA and the second power supply voltage VDDD are connected softly. In some example embodiments, the circuit blocks powered by the second power supply voltage VDDD may be affected by noise or fluctuation of the first power supply voltage VDDA of the other circuit blocks.

The positive feedback circuit 30 according to example embodiments may include fewer transistors, does not cause a floating node, and/or the conduction paths between the first power supply voltage VDDA and the second power supply voltage VDDD may be blocked clearly, in comparison with the positive feedback circuit 102 of FIG. 5B.

As such, the comparator and the image sensor including the comparator according to example embodiments may reduce power consumption and size and have enhanced operation characteristics by removing the static current of the positive feedback circuit included in the comparator.

Figure 6:
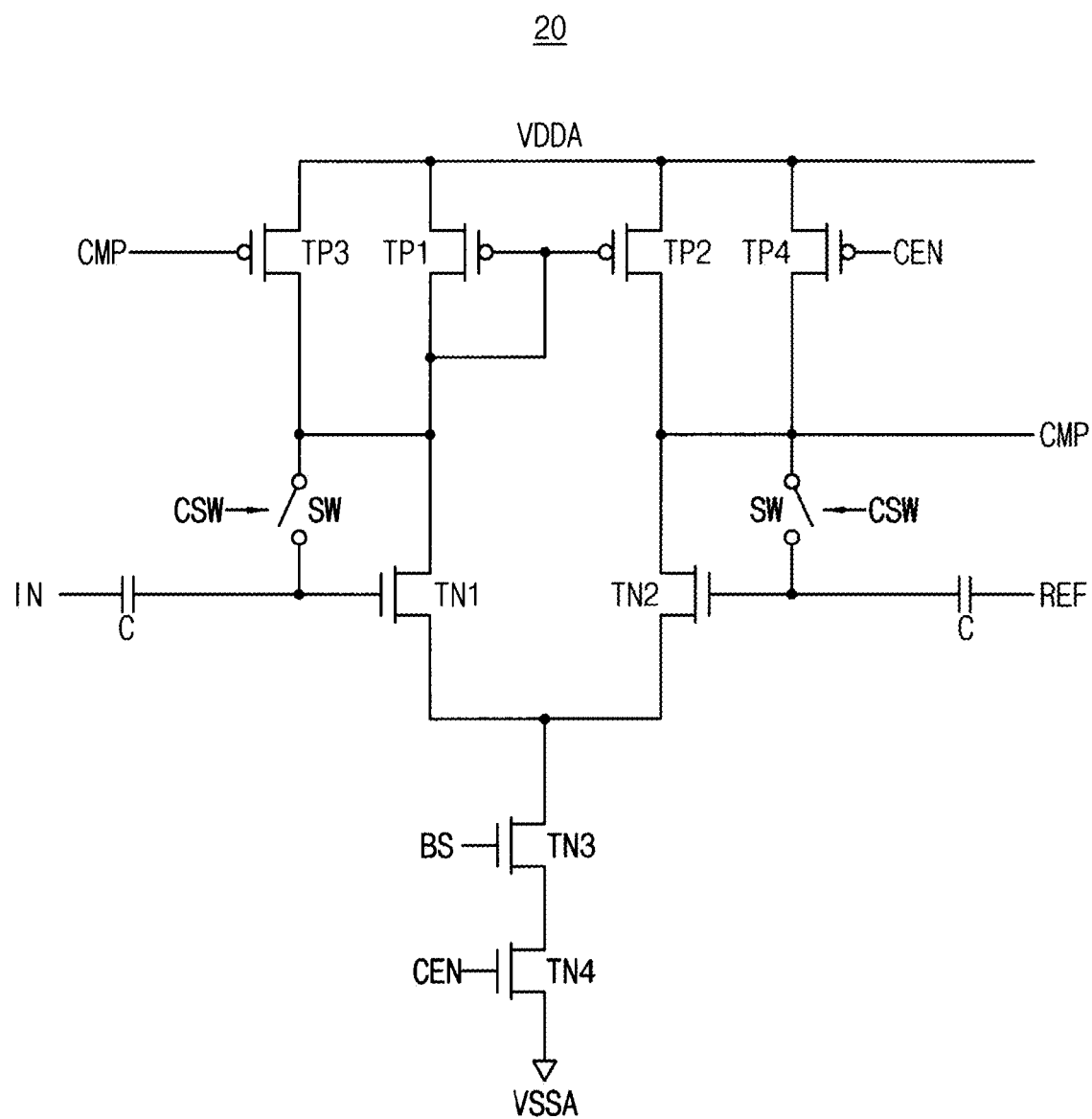
FIG. 6 is a circuit diagram illustrating example embodiments of a comparison circuit included in a comparator according to example embodiments.

FIG. 6 is a circuit diagram illustrating example embodiments of a comparison circuit included in a comparator according to example embodiments.

Referring to FIG. 6, a comparison circuit 20 may be implemented as a differential amplifier circuit that includes transistors TP1~TP4 and TN1~TN4 disposed between the first power supply voltage VDDA and the ground voltage VSSD. The comparison circuit 20 may generate the comparison signal CMP by comparing the input signal IN and the reference signal REF based on control signals CEN, BS and CSW.

The transistors TP1 and TP2 form a current mirror and the transistors TN1 and TN2 form a differential input pair receiving the input signal IN and the reference signal REF. The transistors TP3, TP4 and TN4 may control the enable timing of the comparison circuit 20 in response to the control signal CEN. The transistor TN3 may function as a static current source that generates a bias current based on the control signal BS. The transistors TP1~TP4 may be implemented with PMOS transistors and the transistors TN1~TN4 may be implemented with NMOS transistors.

The switches SW may perform an auto-zeroing function to remove an offset in response to the control signal CSW. To realize a perfect differential configuration and improve the level sensitivity due to the direct input, the decoupling capacitors C may be disposed at the inputs of the input signal IN and the reference signal REF. The comparison circuit 20 may have a simple and robust configuration of the differential amplifier using the static current and the effects of the noises in the voltages and signals may be reduced or prevented.

Figure 7:
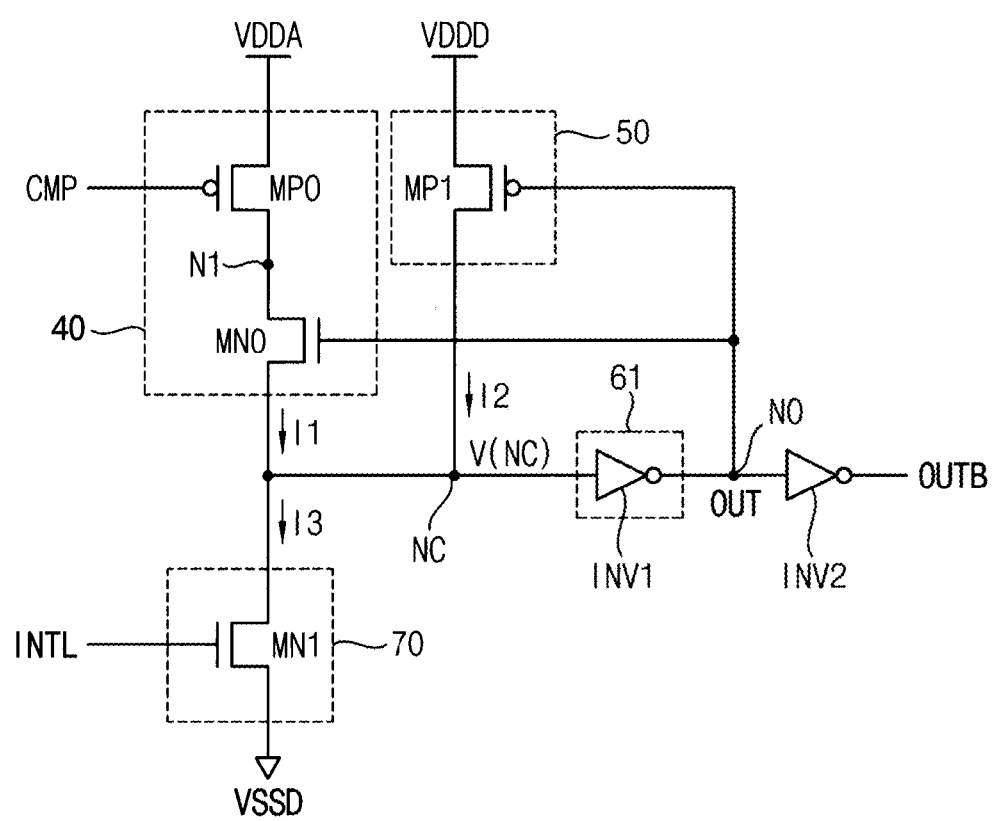
FIG. 7 is a circuit diagram illustrating example embodiments of a positive feedback circuit included in a comparator according to example embodiments.

FIG. 7 is a circuit diagram illustrating example embodiments of a positive feedback circuit included in a comparator according to example embodiments.

Referring to FIG. 7, a positive feedback circuit 31 may include a first circuit 40, a second circuit 50, an output circuit 61 and/or an initialization circuit 70.

The first circuit 40 may electrically connect a first power supply voltage VDDA to a conversion node NC in response to the transition of the comparison signal CMP. When the first circuit 40 electrically connects the first power supply voltage VDDA to the conversion node NC, the first circuit 40 may provide a first current I1 to the conversion node NC. In addition, the first circuit 40 may electrically disconnect the first power supply voltage VDDA from the conversion node NC in response to the transition of the output signal OUT. When the first circuit 40 electrically disconnects the first power supply voltage VDDA from the conversion node NC, the first circuit 40 may block the first current I1 provided to the conversion node NC.

In some example embodiments, as illustrated in FIG. 7, the first circuit 40 may include a first pull-up transistor MP0 and/or a block transistor MN0. The first pull-up transistor MP0 may be connected between the first power supply voltage VDDA and a first node N1 and the first pull-up transistor MP0 may be switched, that is turned on and off in response to the comparison signal CMP. The block transistor MN0 may be connected between the first node N1 and the conversion node NC and the block transistor MN0 may be turned on and off in response to the output signal OUT.

The second circuit 50 may electrically connect the second power supply voltage VDDD to the conversion node NC in response to the transition of the output signal OUT. When the second circuit 50 electrically connects the second power supply voltage VDDD to the conversion node NC, the second circuit 50 may provide a second current I2 to the conversion node NC.

In some example embodiments, as illustrated in FIG. 7, the second circuit 50 may include a second pull-up transistor MP1. The second pull-up transistor MP1 may be connected between the second power supply voltage VDD and the conversion node NC and the second pull-up transistor MP1 may be turned on and off in response to the output signal OUT.

As a result, by operating in response to the same output signal OUT, the block transistor MN0 of the first circuit 40 may electrically disconnect the first power supply voltage VDDA from the conversion node NC in response to the transition of the output signal OUT, and simultaneously the second pull-up transistor MP1 of the second circuit 50 may electrically connect the second power supply voltage VDDD to the conversion node NC in response to the transition of the output signal OUT. The first current I1 and the second current I2 correspond to sourcing currents or pull-up currents that increase the voltage level of the conversion node NC.

As described with reference to FIG. 4, the first current I1 and the second current I2 are not generated simultaneously but alternatively by the complementary switching operations of the block transistor MN0 and the second pull-up transistor MP1. Accordingly, the static current between the first power supply voltage VDDA and the second power supply voltage VDDD may be reduced or prevented.

Such switching operation of the first circuit 40 and the second circuit 50 may be implemented using MOS transistors. In some example embodiments, as illustrated in FIG. 3, the first pull-up transistor MP0 and the second pull-up transistor MP1 may be implemented with PMOS transistors and the block transistor MN0 may be implemented with an NMOS transistor.

According to example embodiments, the voltage level of the second power supply voltage VDDD may be lower than the voltage level of the first power supply voltage VDDA. The first power supply voltage VDDA may be used as an operation voltage of the comparison circuit 20 and an analog circuit block disposed before the comparison circuit 20. The first power supply voltage VDDA may have a relatively high voltage level, for example, 2.8V. The second power supply voltage VDDD may be used as an operation voltage of a digital circuit block after the positive feedback circuit 30. The second power supply voltage VDDD may have a relatively low voltage level, for example, 1.0V. In some example embodiments, a thickness of gate oxides of the first pull-up transistor MP0 and the block transistor MN0 may be greater than a thickness of a gate oxide of the second pull-up transistor MP1.

The output circuit 61 may generate the output signal OUT based on a voltage V(NC) of the conversion node NC. The output circuit 61 may include at least one logic gate connected between the conversion node NC and an output node NO generating the output signal OUT.

In some example embodiments, as illustrated in FIG. 7, the output circuit 61 may include an inverter INV1 configured to receive the voltage V(NC) of the conversion node NC and output the output signal OUT.

The initialization circuit 70 may initialize the voltage V(NC) of the conversion node NC before the transition of the comparison signal CMP. In some example embodiments, as illustrated in FIG. 7, the initialization circuit 70 may include an NMOS transistor MN1 connected between the conversion node NC and a ground voltage VSSD and configured to be turned on and off in response to an initialization signal INTL. When the NMOS transistor is turned on, that is, when the conversion node NC is electrically connected to the ground voltage VSSD, the initialization circuit 70 may provide a third current I3 to the conversion node NC. The third current I3 corresponds to a sinking current or a pull-down current that decreases the voltage level of the conversion node NC.

As described with reference to FIG. 4, the NMOS transistor MN1 of the initialization circuit 70 may be turned on before the first current I1 and the second current I2 are generated. Accordingly the static current or the short current, which may be caused between the first power supply voltage VDDA, the second power supply voltage VDDD and the ground voltage VSSD, may be reduced or prevented.

In some example embodiments, the positive feedback circuit 31 may further include an inverter INV2 connected to the output node NO to generate an inversion output signal OUTB. When the digital circuit block after the positive feedback circuit 31 uses the output signal OUT, the falling edge of the output signal OUT may indicate the comparison time point. In contrast, when the digital circuit block after the positive feedback circuit 31 uses the inversion output signal OUTB, the rising edge of the inversion output signal OUTB may indicate the comparison time point.

The operation of the positive feedback circuit 31 is the same or substantially the same as described with reference to FIG. 4 except the output control signal FRC, and the repeated descriptions are omitted.

FIGS. 8 through 11 are block diagrams illustrating an image sensor according to example embodiments.

Figure 8:
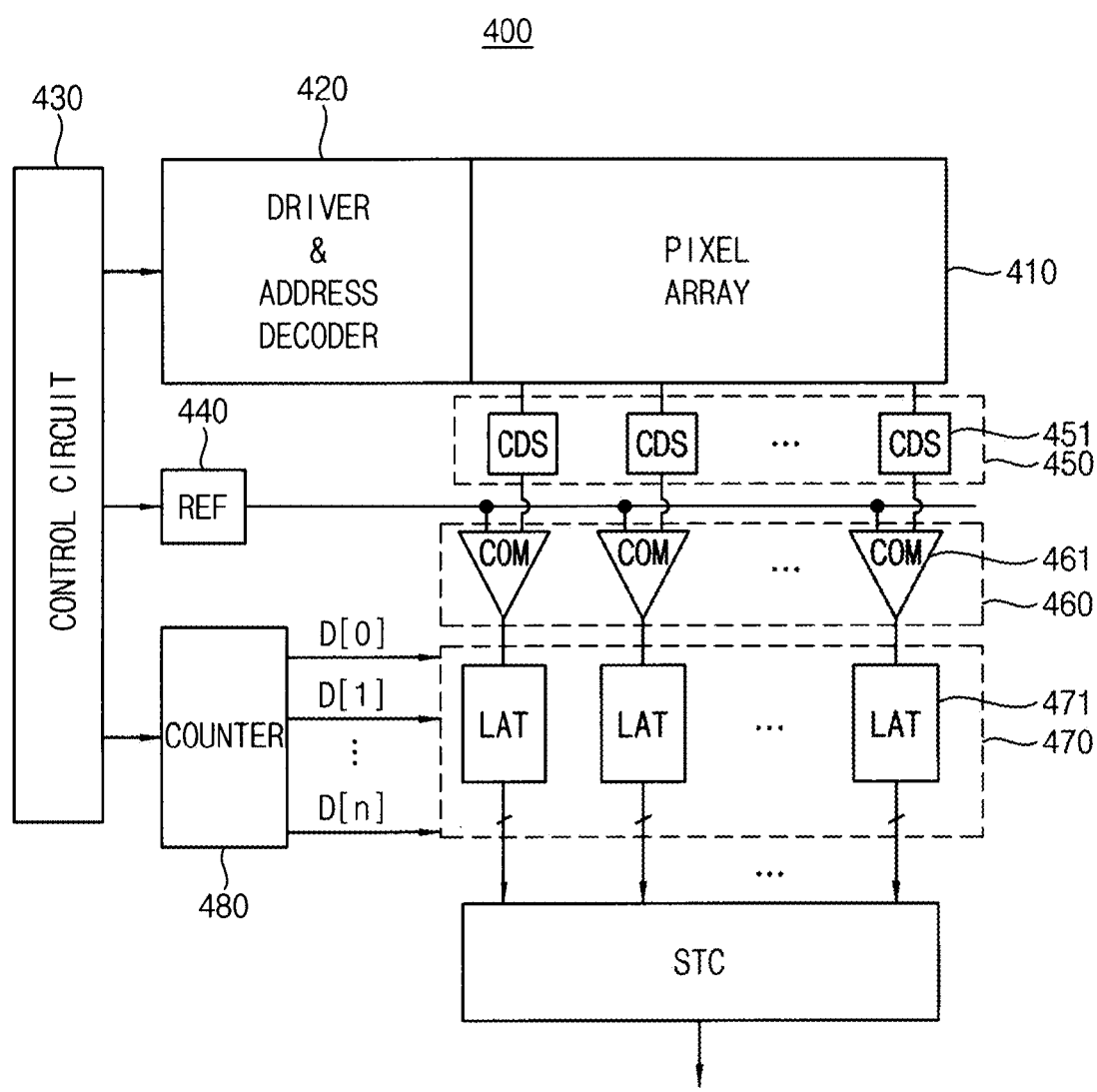
FIGS. 8 through 11 are block diagrams illustrating an image sensor according to example embodiments.

Referring to FIG. 8, an image sensor 400 may include a pixel array 410, a driver/address decoder 420, a control circuit 430, a reference signal generator 440, a correlated double sampling (CDS) unit 450, a comparison unit 460, a latch unit 470, a counter 480 and/or a signal transfer circuit STC.

In a field of image apparatuses, image sensors of a charge-coupled device (CCD) type or a complementary metal oxide semiconductor (CMOS) type are widely used for capturing an image by sensing incident light. The image sensor 400 of FIG. 8 may be a CCD image sensor or a CMOS image sensor.

In an example of the CMOS image sensor, the pixel array 410 includes a plurality of pixels for converting incident lights into electrical analog signals. In the image sensor including unit cells referred to as active pixels or gain cells, a respective signal from each pixel is detected by an address control of the pixels. The active pixel sensor is a kind of address-controlled image sensor, and the driver/address decoder 420 controls an operation of the pixel array 410 by unit of a column and/or a row. The control circuit 430 generates control signals for controlling operations of the other components of the image sensor 400.

The analog signals detected by the pixel array 410 are converted into digital signals by an analog to digital converter (ADC) including the comparison unit 460, the latch unit 470, and the counter 480. The analog signals are output typically column by column, and thus the CDS unit 450, the comparison unit 460 and the latch unit 470 include a plurality of CDS circuits 451, a plurality of comparators 461 and a plurality of latches 471 according to the column number of the pixel array 410. The comparators 461 may include the positive feedback circuit as described with reference to FIGS. 1 through 7.

The analog signals output from the pixel array have variations in a reset component due to respective characteristic of each pixel referred to as a fixed pattern noise (FPN) and respective characteristic of each logic circuit for outputting a voltage signal from a corresponding pixel. Accordingly an effective signal component needs to be abstracted by subtracting the respective reset component from the measured signal component. As such, abstracting the effective signal component corresponding to the difference between the reset component and the measured signal component is referred to as CDS.

The CDS unit 450 performs an analog double sampling (ADS) by obtaining the difference between the reset component and the measured signal component using capacitors and switches, and outputs analog signals corresponding to the effective signal components. The comparison unit 460 compares the analog signals output column by column from the CDS unit 450 with the reference signal (e.g., the ramp signal RAMP) from the reference signal generator 440, and outputs comparison signals column by column. The comparison signals have respective transition timings according to respective effective signal component. The bit signals D[0], D[1], D[2] and D[3] from the counter 480 are commonly provided to the latches 471. The latches 471 latch the bit signals in response to the respective comparison signals and output the latched digital signals column by column.

In addition to the image sensor 400 performing the ADS, also the comparator according to example embodiments may be adopted in the image sensors performing a digital double sampling (DDS) as will be described referring to FIGS. 9 and 10. The DDS is one of the CDS where the analog signals corresponding to the reset component and the measured signal component are converted into the digital signals, respectively, and the effective signal component is abstracted by obtaining the difference between the two digital signals.

Figure 9:
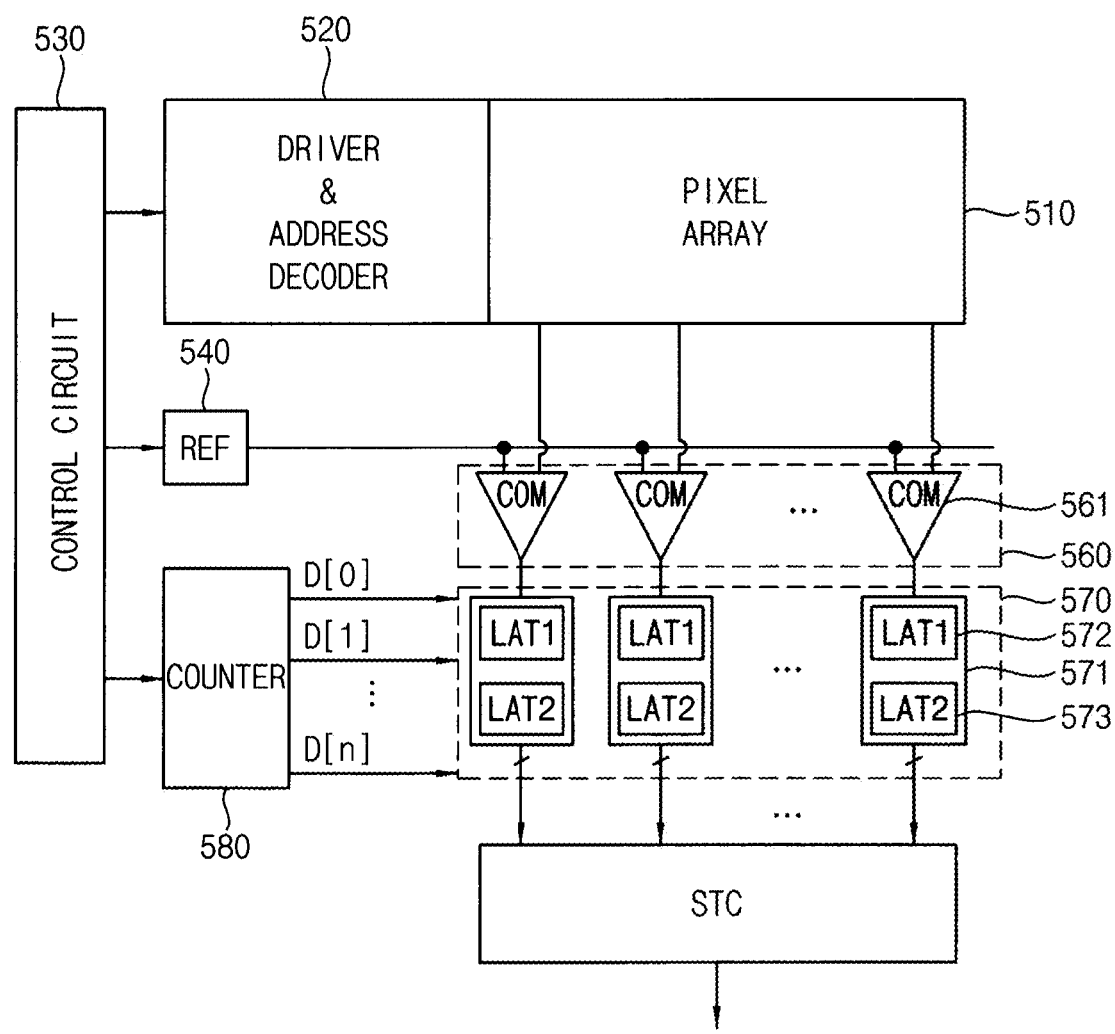

Referring to FIG. 9, an image sensor 500 may include a pixel array 510, a driver/address decoder 520, a control circuit 530, a reference signal generator 540, a comparison unit 560, a latch unit 570, a counter 580 and/or a signal transfer circuit STC.

The comparison unit 560 and the latch unit 570 may include a plurality of comparators 561 and a plurality of latches 571 that are assigned by unit of columns. The comparators 561 may include the positive feedback circuit as described with reference to FIGS. 1 through 7.

The image sensor 500 of FIG. 9 has a configuration for performing the DDS whereas the image sensor 400 of FIG. 8 has a configuration for performing the ADS. Each latch 571 coupled to each column includes a first latch 572 and a second latch 573. The pixel array 510 outputs sequentially a first analog signal and a second analog signal for the CDS, where the first analog signal indicates a reset component and the second analog signal indicates a measured image component.

In a first sampling, each comparator 561 compares the first analog signal indicating the reset component with a ramp signal from the reference signal generator 540, and outputs the comparison signal having a transition time point corresponding to the reset component. Such operations are performed with respect to each column. The bit signals D[0], D[1], D[2], D[3] from the counter 580 are commonly provided to each latch 571, and each latch 571 latches the bit signals D[0], D[1], D[2], D[3] at each transition time point of the corresponding comparison signal to store a first count value in the first latch 572.

In a second sampling, each comparator 561 compares the second analog signal indicating the measured image component with the ramp signal from the reference signal generator 540, and outputs the comparison signal having a transition time point corresponding to the measured image component. Such operations are performed with respect to each column. The bit signals D[0], D[1], D[2], D[3] from the counter 580 are commonly provided to each latch 571, and each latch 571 latches the bit signals D[0](or D0), D[1], D[2], D[3] at each transition time point of the corresponding comparison signal to store a second count value in the second latch 573. The first and second count values stored in the first and second latches 572 and 573 are provided to internal logic circuits to calculate values corresponding to the effective image components. As such, the DDS may be performed by the image sensor 500.

The image sensors 400 and 500 of FIGS. 8 and 9 include the common counter for performing the CDS. Also an image sensor may include a plurality of counters coupled to column by column as illustrated in FIG. 10, which may be referred to as column counters.

Figure 10:
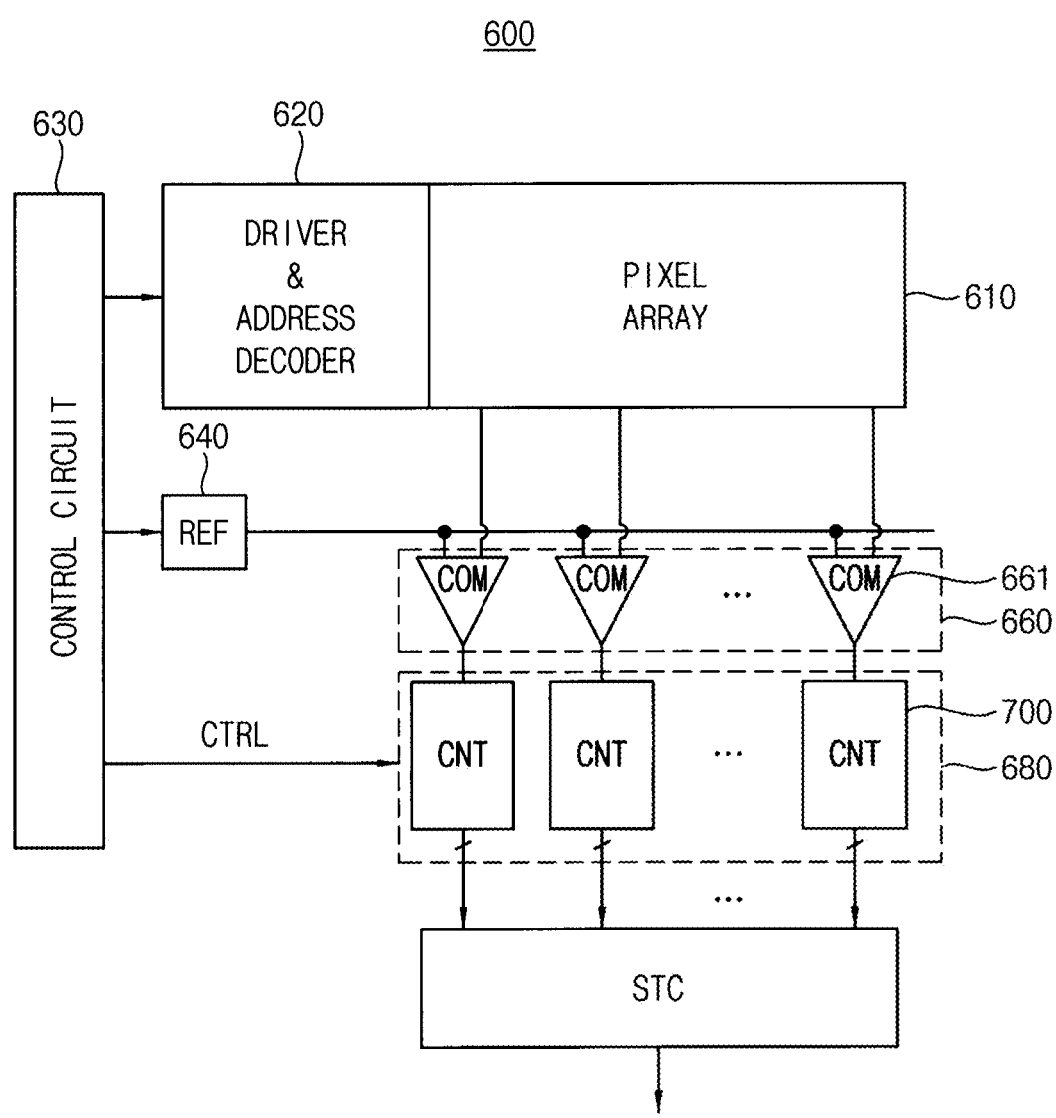

Referring to FIG. 10, an image sensor 600 may include a pixel array 610, a driver/address decoder 620, a control circuit 630, a reference signal generator 640, a comparison unit 660, a counting block 680 and/or a signal transfer circuit STC.

The analog signals detected by the pixel array 610 are converted into digital signals by an ADC including the comparison unit 660 and the counting block 680. The analog signals are output column by column, and thus the comparison unit 660 and counting block 680 include a plurality of comparators 661 and a plurality of counters 700 according to the column number of the pixel array 610. The comparators 661 may include the positive feedback circuit as described with reference to FIGS. 1 through 7.

Using the plurality of comparators 661 and counters 700 coupled to each column, the image sensor 600 may simultaneously process a plurality of pixel signals corresponding one row, thereby enhancing an operation speed and reducing noises.

The pixel array 610 outputs sequentially a first analog signal and a second analog signal for the CDS, where the first analog signal indicates a reset component and the second analog signal indicates a measured image component. Based on the first and second analog signals, the ADC including the comparison unit 660 and the counting block 680 performs the CDS digitally, that is, performs the DDS with respect to the respective columns.

In the image sensors 400, 500 and 600 of FIGS. 8, 9 and 10, the circuits for analog-to-digital conversion are implemented out of, or separate from, the pixel array. In some example embodiments, the circuits for analog-to-digital conversion may be integrated with pixel groups in the pixel array as will be described below with reference to FIG. 11. The circuits for analog-to-digital conversion may be assigned to each pixel group including at least two pixels for a global shuttering operation.

Figure 11:
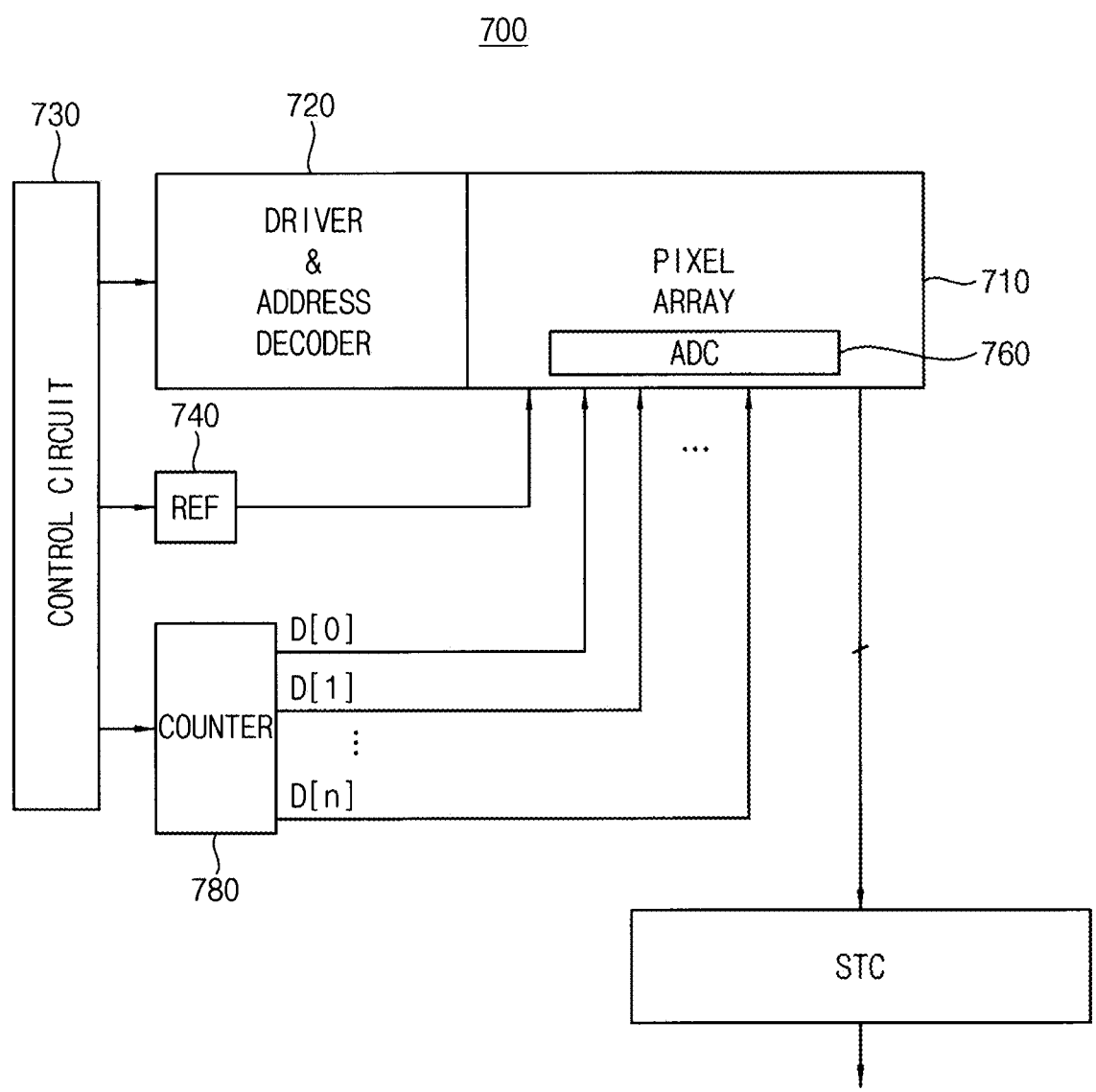

Referring to FIG. 11, an image sensor 700 may include a pixel array 710, a driver/address decoder 720, a control circuit 730, a reference signal generator 740, an analog-to-digital converter ADC 760, a counter 780 and/or a signal transfer circuit STC.

In comparison with the image sensor 500 of FIG. 9 where the analog-to-digital converter including the comparison unit 460 and the latch unit 470 of the image sensor 700 of FIG. 11 may be implemented out of, or separate from, the pixel array 410, the analog-to-digital converter 760 may be integrated in the pixel array 710. Even though FIG. 11 illustrates that the counter circuit 780 is disposed out of, or separate from, the pixel array 710, the counter circuit 780 may also be included in the pixel array 780 according to example embodiments.

Figure 12:
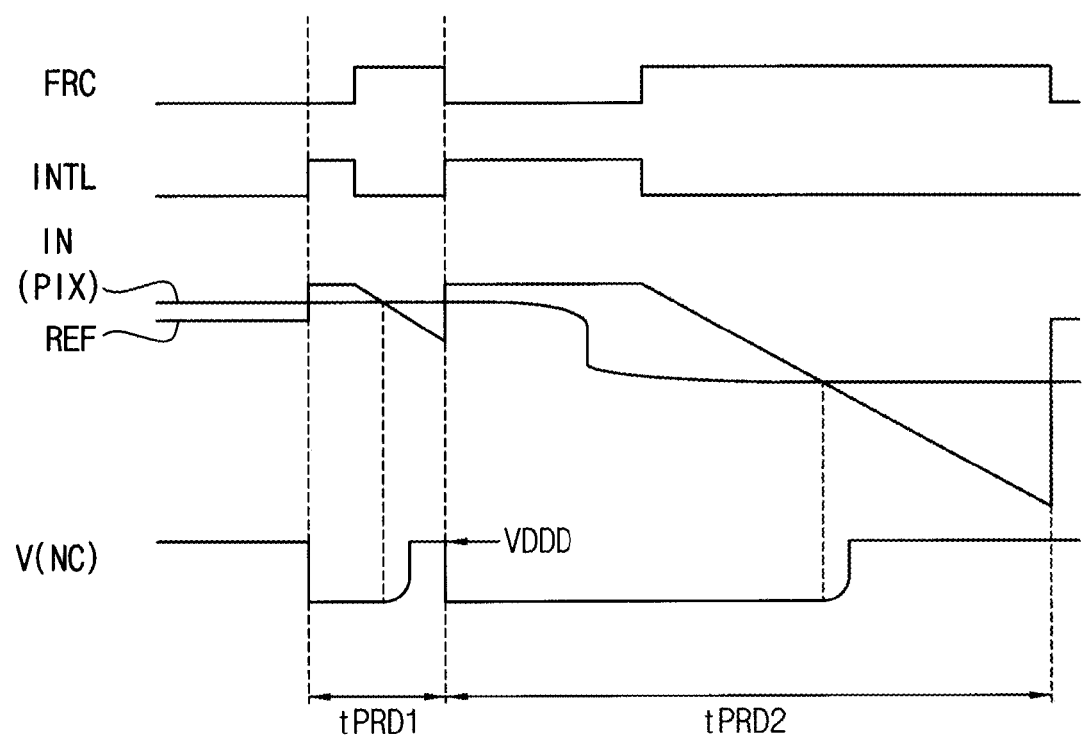
FIG. 12 is a timing diagram illustrating an operation of an image sensor according to example embodiments.

FIG. 12 is a timing diagram illustrating an operation of an image sensor according to example embodiments.

FIG. 12 illustrates the CDS of the image sensor including the comparators adopting the positive feedback circuit 30 of FIG. 3. The sampling of the reset component may be performed during a first period tPRD1 and the sampling of the signal component may be performed during a second period tPRD2. Each operation of the first period tPRD1 and the second period tPRD2 is the same as described with reference to FIGS. 3 and 4, and the repeated descriptions are omitted. The analog pixel signal corresponds to the above-described input signal IN.

FIGS. 13A through 13D are example embodiments of a pixel included in an image sensor according to example embodiments.

Figure 13A:
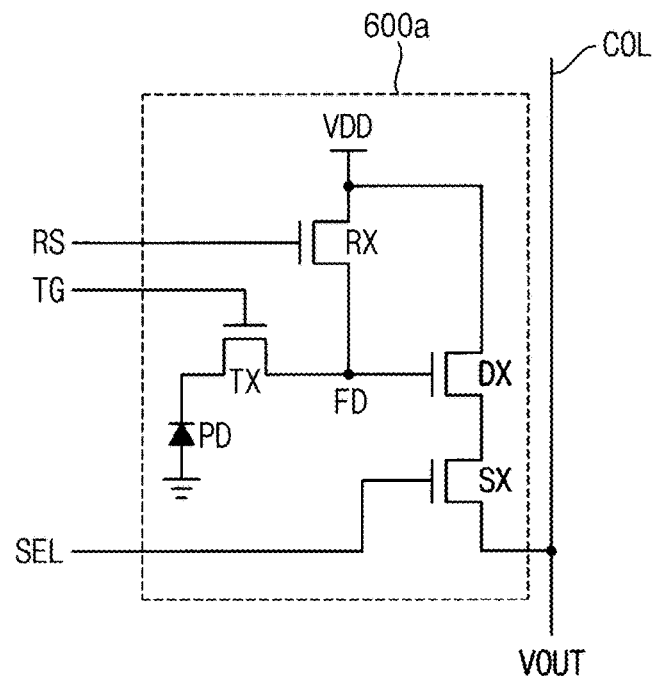
FIGS. 13A through 13D are example embodiments of a pixel included in an image sensor according to example embodiments.

Referring to FIG. 13A, a unit pixel 600a may include a photo-sensitive element such as a photodiode PD, and a readout circuit including a transfer transistor TX, a reset transistor RX, a drive transistor DX and/or a selection transistor SX.

For example, the photodiode PD may include an n-type region in a p-type substrate such that the n-type region and the p-type substrate form a p-n conjunction diode. The photodiode PD receives the incident light and generates a photo-charge based on the incident light. In some example embodiments, the unit pixel 600a may include a phototransistor, a photogate, and/or a pinned photodiode, etc. instead of, or in addition to, the photodiode PD.

The photo-charge generated in the photodiode PD may be transferred to a floating diffusion node FD through the transfer transistor TX. The transfer transistor TX may be turned on in response to a transfer control signal TG. The drive transistor DX functions as a source follower amplifier that amplifies a signal corresponding to the charge on the floating diffusion node FD. The selection transistor SX may transfer the amplified signal VOUT to a column line COL in response to a selection signal SEL. The floating diffusion node FD may be reset by the reset transistor RX. For example, the reset transistor RX may discharge the floating diffusion node FD in response to a reset signal RS for correlated double sampling (CDS).

Figure 13B:
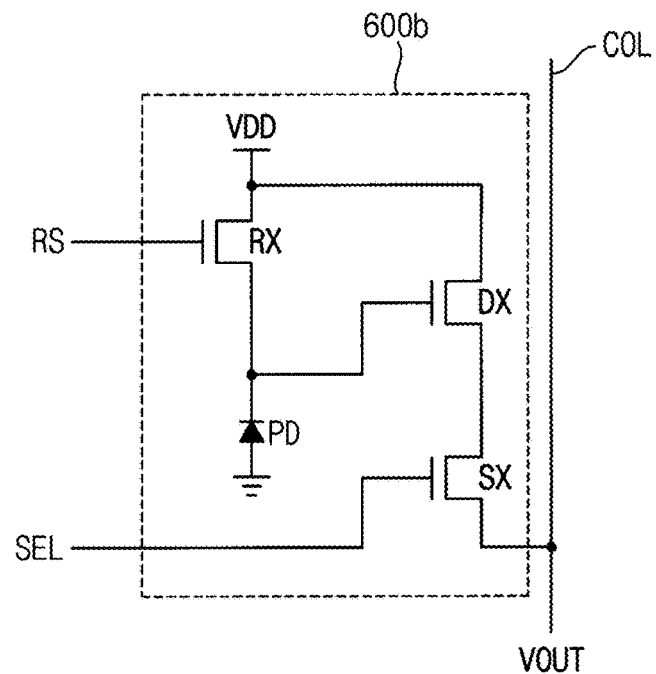
Figure 13C:
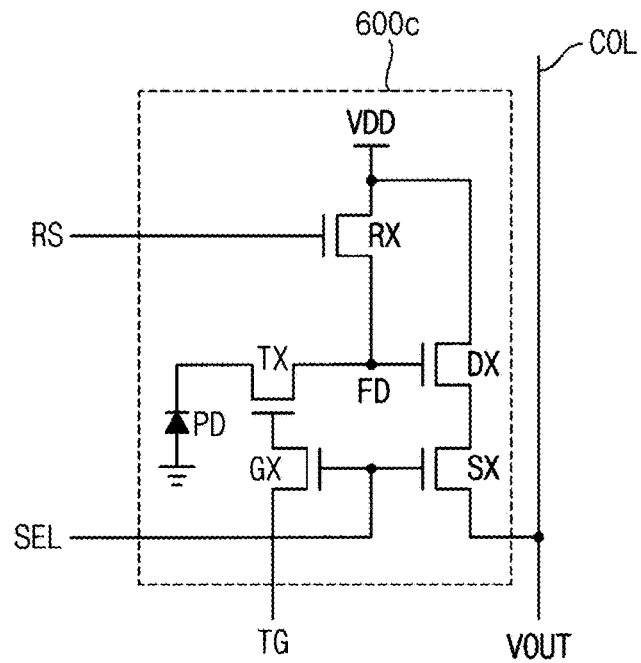
Figure 13D:
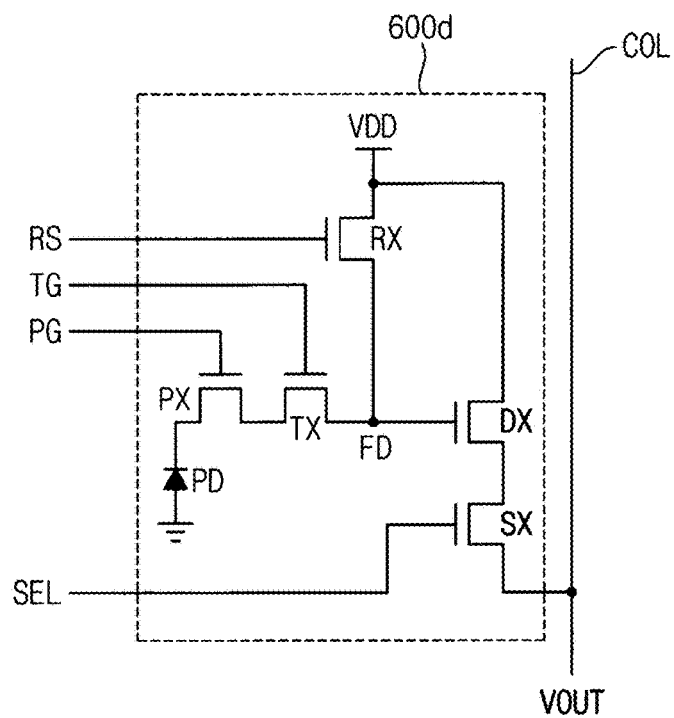

FIG. 13A illustrates the unit pixel 600a of the four-transistor configuration including the four transistors TX, RX, DX and SX. The configuration of the unit pixel may be variously changed as illustrated in FIGS. 13B, 13C, and 13D. Power may be supplied via voltage supply terminal VDD and ground.

Referring to FIG. 13B, a unit pixel 600b may have the three-transistor configuration including a photo-sensitive element such as a photodiode PD, and a readout circuit including a reset transistor RX, a drive transistor DX and/or a selection transistor SX.

Referring to FIG. 13C, a unit pixel 600c may have the five-transistor configuration including a photo-sensitive element such as a photodiode PD, and a readout circuit including a transfer transistor TX, a gate transistor GX, a reset transistor RX, a drive transistor DX and/or a selection transistor SX. The gate transistor GX may selectively apply the transfer control signal TG to the transfer transistor TX in response to the selection signal SEL.

Referring to FIG. 13D, a unit pixel 600d may have the five-transistor configuration including a photo-sensitive element such as a photodiode PD, and a readout circuit including a phototransistor PX, a transfer transistor TX, a reset transistor RX, a drive transistor DX and/or a selection transistor SX. The phototransistor PX may be turned on or off in response to a photogate signal PG. The unit pixel 600d may enabled when the phototransistor PX is turned on and disabled when the phototransistor PX is turned off. The phototransistor PX may be turned on and off in response to a photogate signal PG. While the phototransistor PX is turned on, the photodiode PD may detect the incident light to generate the photo charges. In contrast, while the phototransistor PX is turned off, the photodiode PD may not detect the incident light.

Figure 14:
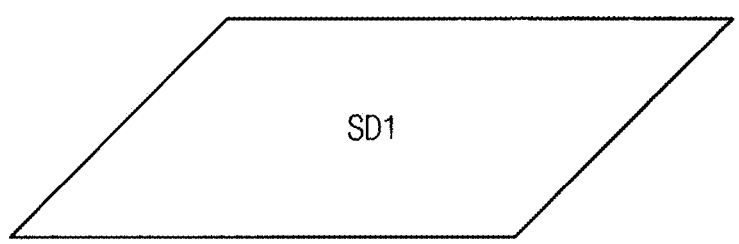
FIG. 14 is a diagram for describing a stack structure of an image sensor according to example embodiments.
Figure 14:
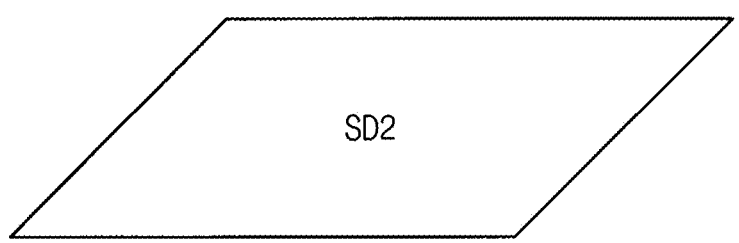
Figure 14:
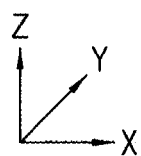
Figure 15:
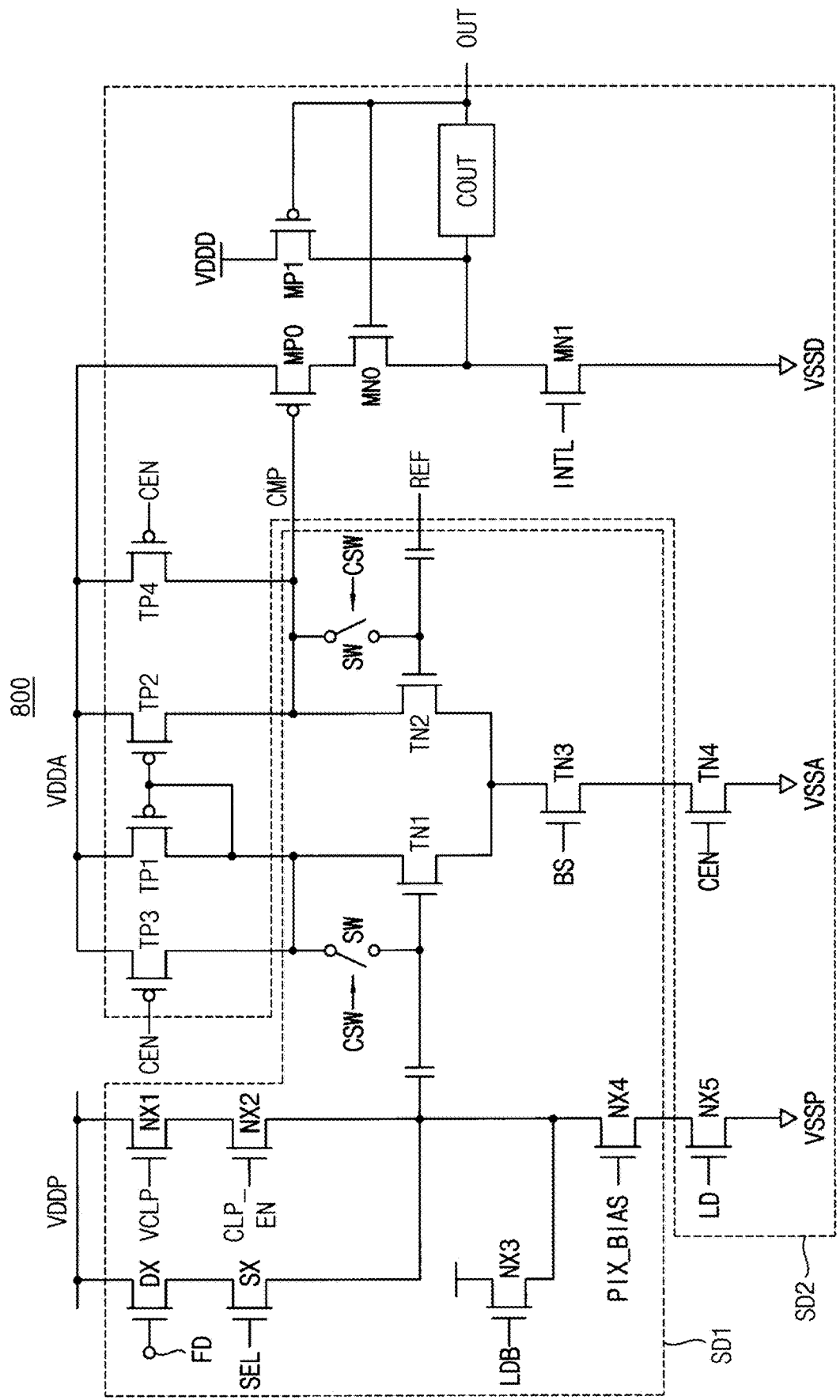
FIG. 15 is a circuit diagram illustrating an image sensor having a stack structure according to example embodiments.

FIG. 14 is a diagram for describing a stack structure of an image sensor according to example embodiments, and FIG. 15 is a circuit diagram illustrating an image sensor having a stack structure according to example embodiments.

Referring to FIG. 14, an image sensor 800 may have a structure in which a plurality semiconductor substrates are stacked in a vertical direction Z, and the plurality of semiconductor substrates include a first semiconductor substrate SD1 and a second semiconductor substrate SD2 disposed below the first semiconductor substrate SD1. A row direction X and a column direction Y may be perpendicular to each other and parallel with the surfaces of the semiconductor substrates. The pads on the bottom surface of the first semiconductor substrate SD1 and the pads on the top surface of the second semiconductor substrate SD2 may be formed at the corresponding positions, and the first semiconductor substrate SD1 and the second semiconductor substrate SD2 may be connected by coupling the pads.

Referring to FIG. 15, the image sensor 800 may include a plurality of transistors, switches SW, capacitors C and an output circuit COUT disposed between power supply voltages VDDP, VDDA and VDDD and ground voltages VSSP, VSSA and VSSD.

The power lines supplying the power supply voltages VDDP, VDDA and VDDD may be electrically separated from one another, and the power lines of the ground voltages VSSP, VSSA and VSSD may be electrically separated from one another.

VDDP and VSSP may be operation voltages of the pixels, VDDA and VSSA may be operation voltages of analog circuit blocks, and VDDD and VSSD may be operation voltages of digital circuit blocks. As described above, the first power supply voltage VDDA may have the higher voltage level than the voltage level of the second power supply voltage VDDD. The power supply voltage VDDP may have the same voltage level as the first power supply voltage VDDA.

The transistors TP1~TP4 and TN1~TN4, the switches SW and the decoupling capacitors C may form the comparison circuit 20 as described with reference to FIG. 6, the transistors MP0, MP1, MN0 and MN1 and the output circuit COUT may form the positive feedback circuit 30 as described with reference to FIGS. 4 and 7, and the repeated descriptions are omitted.

The drive transistor DX and the selection transistor SX correspond to the elements of the pixel as described with reference to FIGS. 13A through 13D, and the other elements of the pixel are omitted for convenience of illustration. The image sensor 800 may further include the transistors NX1~NX5 that operate based on the control signals VCLP, CLP_EN, LDB, LD, and PIX_BIAS.

As illustrated in FIG. 15, the plurality of pixels and a first portion of the analog-to-digital converter may be formed at the first semiconductor substrate SD1 and a second portion of the analog-to-digital converter may be formed at the second semiconductor substrate SD2.

Figure 16:
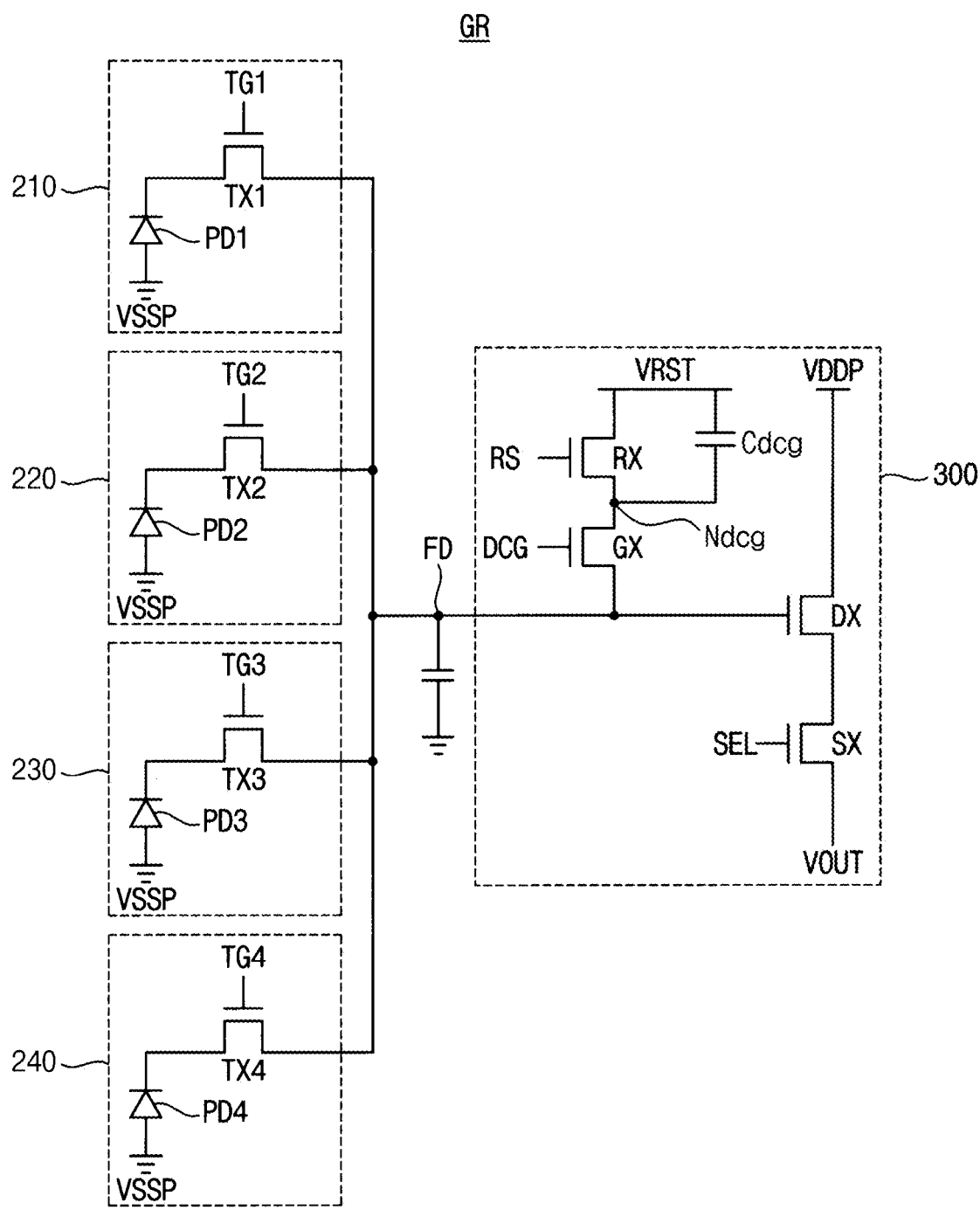
FIG. 16 is a circuit diagram illustrating a shared structure in which four pixels are commonly connected to a single floating diffusion node.
Figure 17:
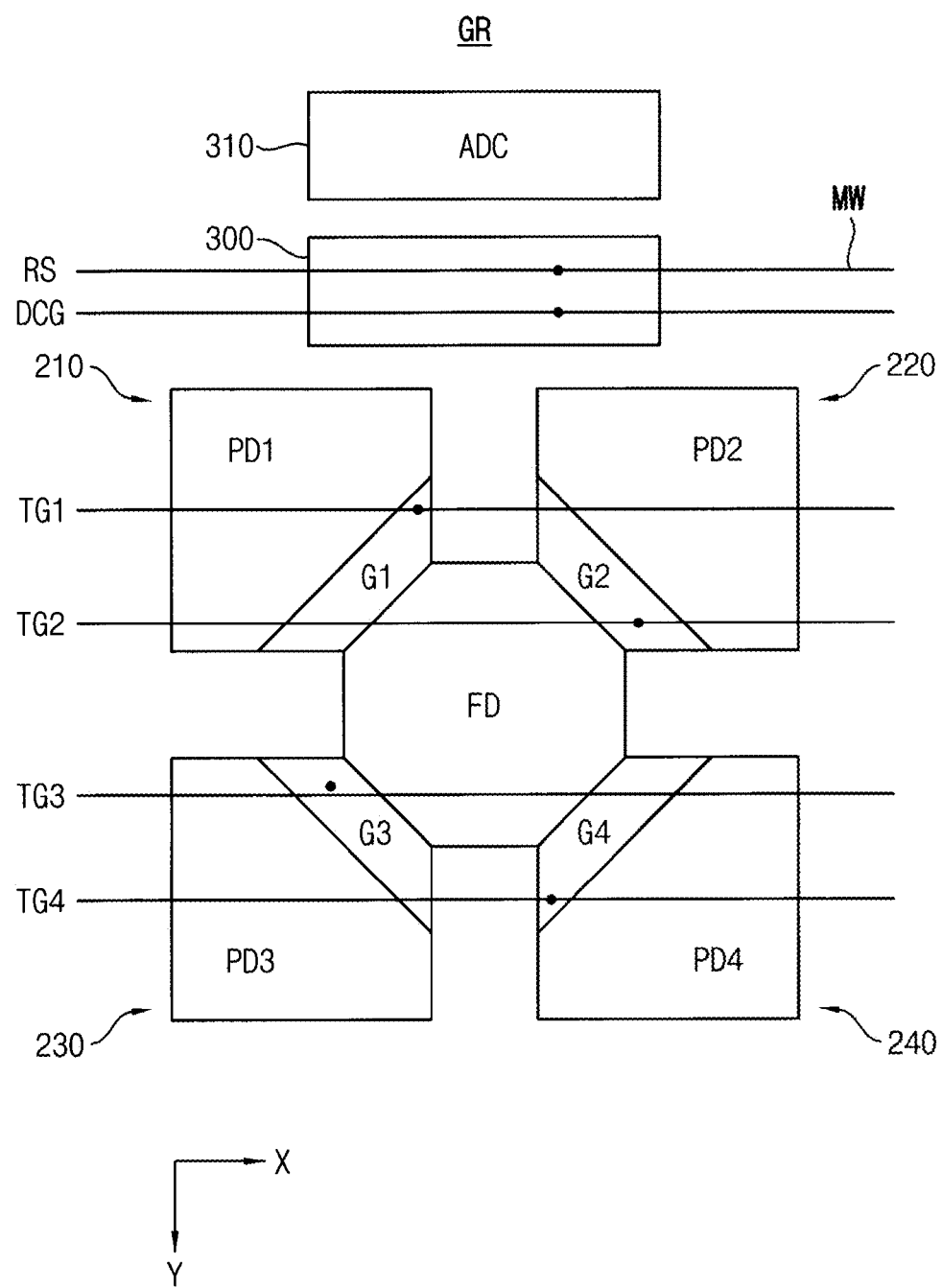
FIG. 17 is a top view illustrating an example layout of the shared structure of FIG. 16.

FIG. 16 is a circuit diagram illustrating a shared structure in which four pixels are commonly connected to a single floating diffusion node, and FIG. 17 is a top view illustrating an example layout of the shared structure of FIG. 16.

Referring to FIGS. 16 and 17, a pixel group GR may include a floating diffusion node FD, a first pixel 210, a second pixel 220, a third pixel 230, a fourth pixel 240, a readout circuit 300 and/or an analog-to-digital conversion unit 310. The first pixel 210, the second pixel 220, the third pixel 230, and the fourth pixel 240 may be commonly connected to the floating diffusion node FD. The pixel group GR, as illustrated in FIGS. 16 and 17, may be arranged repeatedly in a row direction X and a column direction Y in the pixel array.

Control signals TG1, TG2, TG3, TG4, RS and DCG may be provided from the row driver (e.g. the driver/address decoder in FIGS. 8 through 11) to the pixel group GR through wires MW extended in the row direction X.

The analog-to-digital conversion unit 310 may be assigned to each pixel group GR. For example, the analog-to-digital conversion unit 310 may include one comparator and one latch as described with reference to FIGS. 8 through 11. The latches may be implemented with static random access memory (SRAM) cells. Even though not illustrated in the figures, the analog-to-digital conversion unit 310 may be connected to the readout circuit 300 and external circuits through wires extended in the column direction Y.

The first pixel 210 may include a first photodiode PD1 and a first transfer transistor TX1. The second pixel 220 may include a second photodiode PD2 and a second transfer transistor TX2. The third pixel 230 may include a third photodiode PD3 and a third transfer transistor TX33. The fourth pixel 240 may include a fourth photodiode PD4 and a fourth transfer transistor TX4. In FIG. 17, G1~G4 indicate gate electrodes of the first through fourth transfer transistors TX1~TX4, respectively.

The readout circuit 300 may include a reset transistor MR, a gain adjusting transistor GX, a capacitor Cdcg, a source follower transistor or a driving transistor DX, and/or a selection transistor SX. FIG. 16 illustrates a non-limiting example where each pixel includes one transistor and the read circuit includes four transistors, but the method of operating the image sensor according to example embodiments may be applied to operate an image sensor of various configurations other than that of FIG. 16.

As illustrated in FIGS. 16 and 17, a plurality of pixels may be divided into a plurality of pixel groups and each of the plurality of pixel groups may include at least two pixels sharing a floating diffusion node. Each analog-to-digital conversion unit 310 may be assigned to each of the plurality of pixel groups.

The reset transistor RX may be connected between a reset voltage VRST and a gain adjusting node Ndcg and the reset transistor RX may be turned on and off in response to a reset signal RS. The gain adjusting transistor GX may be connected between the gain adjusting node N dcg and the floating diffusion node FD and the gain adjusting transistor GX may be turned on and off in response to a gain adjusting signal DCG. The capacitor Cdcg may be connected in parallel with the reset transistor RX between the reset voltage VRST and the gain adjusting node Ndcg. As described with reference to FIG. 18, different gains may be implemented using the gain adjusting transistor CX and the capacitor Cdcg.

Figure 18:
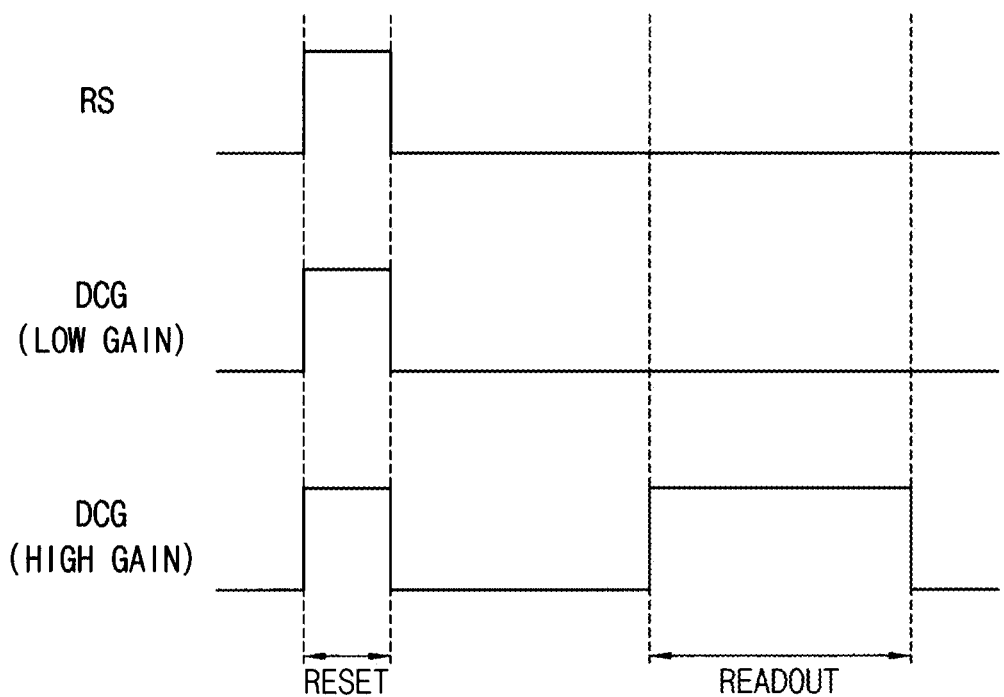
FIG. 18 is a timing diagram illustrating an example operation in the shared structure of FIG. 16.

FIG. 18 is a timing diagram illustrating an example operation in the shared structure of FIG. 16.

Referring to FIGS. 16, 17 and 18, the reset transistor RX and the gain adjusting transistor GX may be turned on when the floating diffusion node FD is reset. The reset transistor RX may be turned off and the gain adjusting transistor GX may be turned on when a voltage of the floating diffusion node FD is read out with a first gain (e.g., low gain). The reset transistor RX and the gain adjusting transistor GX may be turned off when the voltage of the floating diffusion node FD is read out with a second gain (e.g., high gain) higher than the first gain.

Figure 19:
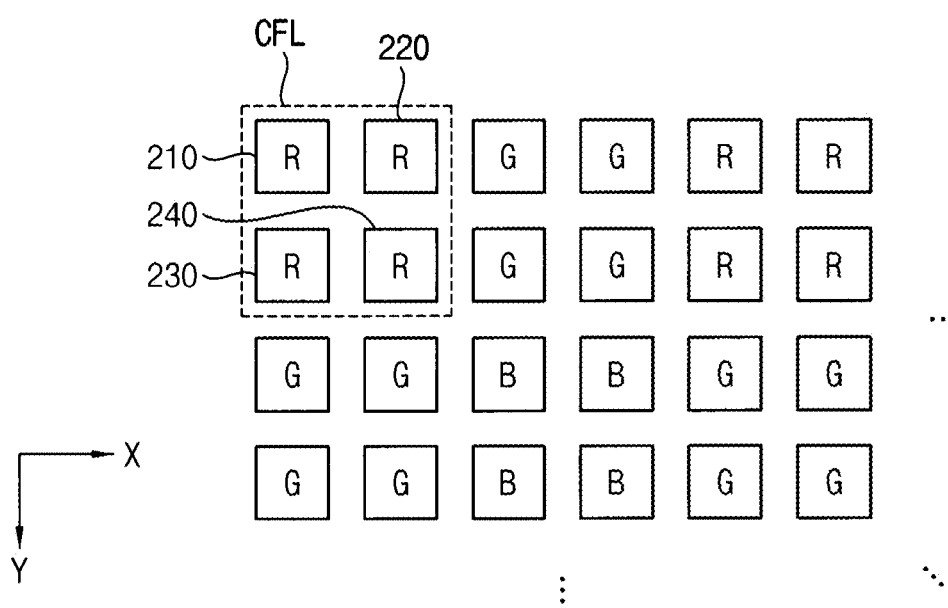
FIG. 19 is a diagram illustrating an example arrangement of colors in the shared structure of FIG. 16.

FIG. 19 is a diagram illustrating an example arrangement of colors in the shared structure of FIG. 16.

Referring to FIG. 19, every four pixels may form one pixel group, and the pixels in the same pixel group may represent the same color, In other words, the same color filter CFL may be formed above each pixel group. In FIG. 19, R indicates a red color filter, G indicates a green color filter and B indicates a blue color filter.

Figure 20:
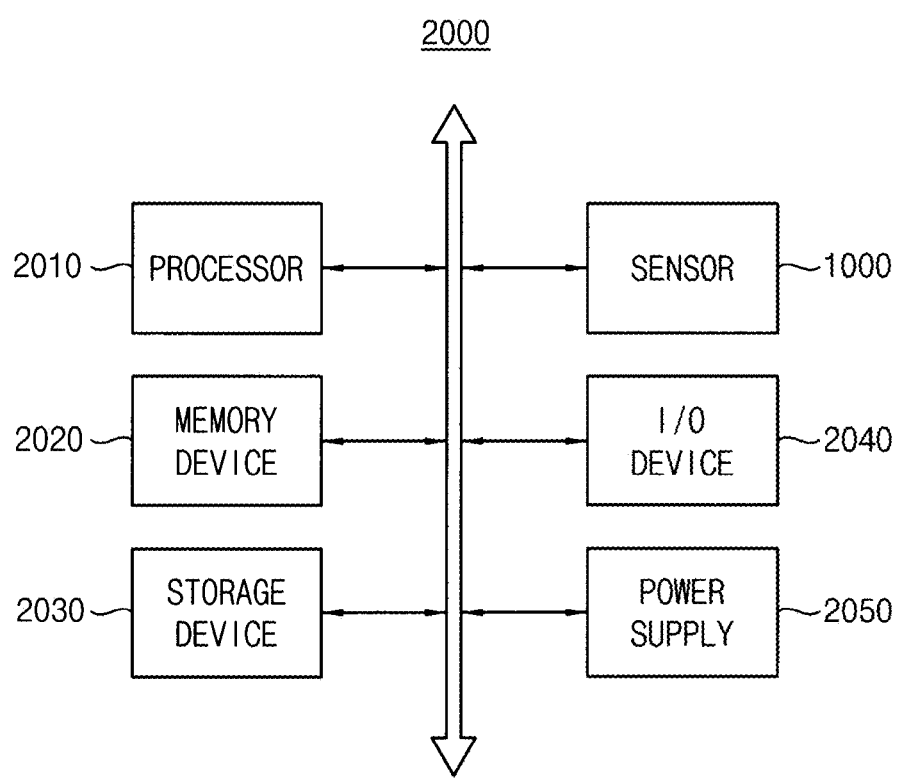
FIG. 20 is a block diagram illustrating a computing system including an image sensor according to example embodiments.

FIG. 20 is a block diagram illustrating a computing system including an image sensor according to example embodiments.

Referring to FIG. 20, a computing system 2000 may include a processor 2010, a memory device 2020, a storage device 2030, an input/output device 2040, a power supply 2050 and an image sensor 100. Although not illustrated in FIG. 20, the computing system 2000 may further include ports that communicate with a video card, a sound card, a memory card, a universal serial bus (USB) device, and/or other electronic devices.

The processor 2010 may perform various calculations or tasks. According to some embodiments, the processor 2010 may be a microprocessor or a central processing unit (CPU). The processor 2010 may communicate with the memory device 2020, the storage device 2030 and the input/output device 2040 via an address bus, a control bus, and/or a data bus. In some example embodiments, the processor 2010 may be coupled to an extended bus, such as a peripheral component interconnection (PCI) bus. The memory device 2020 may store data for operating the computing system 2000. For example, the memory device 2020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device 2030 may include a solid-state drive (SSD), a hard disk drive (HDD), a compact-disc read-only memory (CD-ROM), etc. The input/output device 2040 may include an input device (e.g., a keyboard, a keypad, a mouse, etc.) and an output device (e.g., a printer, a display device, etc.). The power supply 2050 supplies operation voltages for the computing system 2000.

The image sensor 1000 may communicate with the processor 2010 via buses or other communication links. The image sensor 1000 may include a plurality of comparators as described above. The comparator may include a comparison circuit configured to generate a comparison signal by comparing an input signal and a reference signal, and a positive feedback circuit configured to generate an output signal based on the comparison signal, such that the output signal transitions more rapidly than the comparison signal. The positive feedback circuit may include a first circuit, a second circuit and an output circuit. The first circuit may electrically connect a first power supply voltage to a conversion node in response to a transition of the comparison signal and electrically disconnect the first power supply voltage from the conversion node in response to a transition of the output signal. The second circuit may electrically connect a second power supply voltage to the conversion node in response to the transition of the output signal. The output circuit may generate the output signal based on a voltage of the conversion node.

Any of the functional blocks described above, for example, control circuits, 430, 530, 630, 730 and/or processor 2010 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As such, the comparator and the image sensor including the comparator according to example embodiments may reduce power consumption and/or size and/or have enhanced operation characteristics by removing the static current of the positive feedback circuit included in the comparator.

The inventive concepts may be applied to any electronic devices and systems including a compactor. For example, the inventive concepts may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. A comparator comprising:
 a comparison circuit configured to generate a comparison signal by comparing an input signal and a reference signal; and
 a positive feedback circuit configured to generate an output signal based on the comparison signal, the output signal transitioning more rapidly than the comparison signal, the positive feedback circuit comprising:
  a first circuit configured to electrically connect a first power supply voltage to a conversion node in response to a transition of the comparison signal and electrically disconnect the first power supply voltage from the conversion node in response to a transition of the output signal;
  a second circuit configured to electrically connect a second power supply voltage to the conversion node in response to the transition of the output signal; and
  an output circuit configured to generate the output signal based on a voltage of the conversion node.

2. The comparator of claim 1, wherein the positive feedback circuit has a configuration such that the first power supply voltage, the second power supply voltage and a ground voltage are not electrically connected to each other to prevent generation of a static current.

3. The comparator of claim 1, wherein a voltage level of the second power supply voltage is lower than a voltage level of the first power supply voltage.

4. The comparator of claim 1, wherein the first circuit comprises:
 a first pull-up transistor connected between the first power supply voltage and a first node and configured to be turned on and off in response to the comparison signal; and
 a block transistor connected between the first node and the conversion node and configured to be turned on and off in response to the output signal.

5. The comparator of claim 4, wherein the second circuit comprises:
a second pull-up transistor connected between the second power supply voltage and the conversion node and configured to be turned on and off in response to the output signal.

6. The comparator of claim 5, wherein a thickness of gate oxides of the first pull-up transistor and the block transistor is greater than a thickness of a gate oxide of the second pull-up transistor.

7. The comparator of claim 5, wherein the second pull-up transistor is configured to turn off when the block transistor is turned on and the second pull-up transistor is configured to turn on when the block transistor is turned off.

8. The comparator of claim 5, wherein the first pull-up transistor and the second pull-up transistor are P-channel metal oxide semiconductor (PMOS) transistors and the block transistor is an N-channel metal oxide semiconductor (NMOS) transistor.

9. The comparator of claim 1, wherein the output circuit comprises:
at least one logic gate connected between the conversion node and an output node configured to generate the output signal.

10. The comparator of claim 1, wherein the output circuit comprises:
a NAND gate configured to receive the voltage of the conversion node and an output control signal and output the output signal.

11. The comparator of claim 1, wherein the output circuit comprises:
an inverter configured to receive the voltage of the conversion node and output the output signal.

12. The comparator of claim 1, wherein the positive feedback circuit further comprises:
an initialization circuit configured to initialize the voltage of the conversion node before the transition of the comparison signal.

13. The comparator of claim 12, wherein the initialization circuit comprises:
an NMOS transistor connected between the conversion node and a ground voltage and configured to be turned on and off in response to an initialization signal.

14. An image sensor comprising:
a pixel array comprising a plurality of pixels configured to convert incident light to analog signals; and
an analog-to-digital converter configured to convert the analog signals output from the pixel array to digital data,
wherein the analog-to-digital converter comprises:
a plurality of comparators configured to generate output signals based on the analog signals and a reference signal, and
wherein each of the plurality of comparators comprises:
a comparison circuit configured to generate a comparison signal by comparing an input signal corresponding to each of the analog signals and the reference signal; and
a positive feedback circuit configured to generate an output signal based on the comparison signal, the output signal transitioning more rapidly than the comparison signal, the positive feedback circuit comprising:
a first circuit configured to electrically connect a first power supply voltage to a conversion node in response to a transition of the comparison signal and electrically disconnect the first power supply voltage from the conversion node in response to a transition of the output signal;
a second circuit configured to electrically connect a second power supply voltage to the conversion node in response to the transition of the output signal; and
an output circuit configured to generate the output signal based on a voltage of the conversion node.

15. The image sensor of claim 14, wherein the positive feedback circuit has a configuration such that the first power supply voltage, the second power supply voltage and a ground voltage are not electrically connected to each other to prevent generation of a static current.

16. The image sensor of claim 14, wherein the image sensor has a structure in which a plurality semiconductor substrates are stacked in a vertical direction, and the plurality of semiconductor substrates include a first semiconductor substrate and a second semiconductor substrate below the first semiconductor substrate such that the plurality of pixels and a first portion of the analog-to-digital converter are at the first semiconductor substrate and a second portion of the analog-to-digital converter is at the second semiconductor substrate.

17. The image sensor of claim 16, wherein the plurality of pixels are divided into a plurality of pixel groups and each of the plurality of pixel groups includes at least two pixels sharing a floating diffusion node, and each of the plurality of comparators is assigned to each of the plurality of pixel groups.

18. The image sensor of claim 17, wherein each of the plurality of pixel groups comprises:
a reset transistor connected between a reset voltage and a gain adjusting node and configured to be turned on and off in response to a reset signal;
a gain adjusting transistor connected between the gain adjusting node and the floating diffusion node and configured to be turned on and off in response to a gain adjusting signal; and
a capacitor connected in parallel with the reset transistor between the reset voltage and the gain adjusting node.

19. The image sensor of claim 18, wherein the reset transistor and the gain adjusting transistor are configured to turn on when the floating diffusion node is reset,
wherein the reset transistor is configured to turn off and the gain adjusting transistor is configured to turn on when a voltage of the floating diffusion node is read out with a first gain, and
wherein the reset transistor and the gain adjusting transistor are configured to turn off when the voltage of the floating diffusion node is read out with a second gain higher than the first gain.

20. A comparator comprising:
a comparison circuit configured to generate a comparison signal by comparing an input signal and a reference signal; and
a positive feedback circuit configured to generate an output signal based on the comparison signal, the output signal transitioning more rapidly than the comparison signal, the positive feedback circuit comprising:
a first P-channel metal oxide semiconductor (PMOS) transistor connected between a first power supply voltage and a first node and configured to be turned on and off in response to the comparison signal;
a first N-channel metal oxide semiconductor (NMOS) transistor connected between the first node and a conversion node and configured to be turned on and off in response to the output signal;

a second PMOS transistor connected between a second power supply voltage and the conversion node and configured to be turned on and off in response to the output signal;

a second NMOS transistor connected between the conversion node and a ground voltage and configured to be turned on and off in response to an initialization signal; and an output circuit configured to generate the output signal based on a voltage of the conversion node.

* * * * *